United States Patent
Lee et al.

(10) Patent No.: US 8,455,277 B2
(45) Date of Patent: Jun. 4, 2013

(54) THIN FILM TRANSISTOR ARRAY PANEL AND MANUFACTURING METHOD THEREOF

(75) Inventors: Je-Hun Lee, Seoul (KR); Sung-Jin Kim, Seongnam-si (KR); Hee-Joon Kim, Yongin-si (KR); Chang-Oh Jeong, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/523,767

(22) Filed: Jun. 14, 2012

(65) Prior Publication Data

US 2012/0315731 A1 Dec. 13, 2012

Related U.S. Application Data

(62) Division of application No. 12/417,280, filed on Apr. 2, 2009, now Pat. No. 8,207,534, which is a division of application No. 11/260,017, filed on Oct. 26, 2005, now Pat. No. 7,527,992.

(30) Foreign Application Priority Data

Oct. 26, 2004 (KR) .................. 10-2004-0085686
Jul. 8, 2005 (KR) .................. 10-2005-0061832

(51) Int. Cl.
*H01L 21/84* (2006.01)
(52) U.S. Cl.
USPC .............. 438/29; 438/34; 438/158; 257/72; 257/E21.414; 257/E21.7
(58) Field of Classification Search
USPC ........ 438/155, 158, 29, 34; 257/72, E21.414, 257/E21.7
See application file for complete search history.

(56) References Cited

U.S. PATENT DOCUMENTS

| | | | |
|---|---|---|---|
| 5,327,268 | A | 7/1994 | Takabatake et al. |
| 5,642,213 | A | 6/1997 | Mase et al. |
| 5,973,383 | A | 10/1999 | Cole et al. |
| 6,210,494 | B1 | 4/2001 | Cole et al. |
| 6,218,206 | B1 | 4/2001 | Inoue et al. |
| 6,236,064 | B1 | 5/2001 | Mase et al. |
| 6,468,822 | B2 | 10/2002 | Maeda et al. |
| 6,552,759 | B2 | 4/2003 | Kim et al. |

(Continued)

FOREIGN PATENT DOCUMENTS

| | | |
|---|---|---|
| JP | 03-261005 A | 11/1991 |
| JP | 06-018930 A | 1/1994 |

(Continued)

*Primary Examiner* — Mary Wilczewski
(74) *Attorney, Agent, or Firm* — Innovation Counsel LLP

(57) ABSTRACT

A thin film transistor array panel is provided, which includes a plurality of gate lines, a plurality of common electrodes, a gate insulating layer covering the gate lines and the common electrodes, a plurality of semiconductor layers formed on the gate insulating layer, a plurality of data lines including a plurality of source electrodes and formed on the semiconductor layer, a plurality of drain electrodes formed on the semiconductor layer, and a plurality of pixel electrodes overlapping the common electrodes and connected to the drain electrodes. Because the common electrodes are made of ITON, IZON, or a-ITON, or a double layer of ITO/ITON, IZO/IZON, or a-a-ITO/a-ITON, when H2 or SiH4 are injected to form a silicon nitride (SiNX) layer on the common electrodes, the opaque metal Sn or Zn is not produced on the surfaces of the common electrode.

7 Claims, 54 Drawing Sheets

U.S. PATENT DOCUMENTS

| | | | |
|---|---|---|---|
| 6,790,716 B2 | 9/2004 | Cha et al. | |
| 6,841,431 B2 | 1/2005 | Lee et al. | |
| 6,909,162 B2 | 6/2005 | Wu et al. | |
| 7,187,003 B2 | 3/2007 | Kong et al. | |
| 7,262,085 B2 | 8/2007 | Gotoh et al. | |
| 7,298,021 B2 | 11/2007 | Yamazaki et al. | |
| 7,400,365 B2 | 7/2008 | Gotoh et al. | |
| 7,619,254 B2 * | 11/2009 | Lee et al. | 257/72 |
| 7,821,009 B2 * | 10/2010 | Park | 257/72 |
| 8,031,285 B2 * | 10/2011 | Kim et al. | 349/44 |
| 8,044,399 B2 * | 10/2011 | Hino et al. | 257/59 |
| 8,372,701 B2 * | 2/2013 | Lee et al. | 438/151 |
| 2001/0029054 A1 | 10/2001 | Maeda et al. | |
| 2002/0176030 A1 * | 11/2002 | Matsumoto | 349/43 |
| 2003/0086011 A1 | 5/2003 | Wu et al. | |
| 2003/0134460 A1 | 7/2003 | Forbes et al. | |
| 2005/0024549 A1 | 2/2005 | Gotoh et al. | |
| 2005/0122351 A1 | 6/2005 | Yamazaki et al. | |
| 2005/0158665 A1 | 7/2005 | Maekawa et al. | |
| 2005/0179036 A1 | 8/2005 | Yamazaki et al. | |
| 2005/0214983 A1 | 9/2005 | Maekawa | |
| 2005/0244995 A1 | 11/2005 | Fukuchi et al. | |
| 2006/0046476 A1 | 3/2006 | Nakamura et al. | |
| 2006/0108587 A1 | 5/2006 | Lee et al. | |
| 2006/0202202 A1 | 9/2006 | Denda et al. | |
| 2006/0250511 A1 | 11/2006 | Lyu et al. | |
| 2006/0292726 A1 | 12/2006 | Akimoto et al. | |
| 2007/0018152 A1 | 1/2007 | Seki et al. | |
| 2007/0057627 A1 | 3/2007 | Kidu et al. | |
| 2007/0058099 A1 | 3/2007 | Eguchi | |
| 2007/0072439 A1 | 3/2007 | Akimoto et al. | |
| 2008/0119030 A1 | 5/2008 | Kunii | |
| 2008/0137015 A1 | 6/2008 | Niiya | |
| 2008/0173870 A1 | 7/2008 | Kim et al. | |
| 2008/0182368 A1 | 7/2008 | Kunii | |

FOREIGN PATENT DOCUMENTS

| | | |
|---|---|---|
| JP | 06-139844 A | 5/1994 |
| JP | 07-078526 A | 3/1995 |
| JP | 11-158609 A | 6/1999 |
| JP | 11-335815 A | 12/1999 |
| JP | 2001-056476 A | 2/2001 |
| JP | 2001-183639 A | 7/2001 |
| JP | 2001-223217 A | 8/2001 |
| JP | 2002-329701 A | 11/2002 |
| JP | 2003-295207 A | 10/2003 |
| JP | 2004-104096 A | 4/2004 |
| JP | 2004-191958 A | 7/2004 |
| JP | 2005-019205 A | 1/2005 |
| JP | 2005-047187 A | 2/2005 |
| JP | 2006-133769 A | 5/2006 |
| KR | 20000073119 A | 12/2000 |
| KR | 1020010066244 A | 7/2001 |
| KR | 1020010113266 A | 12/2001 |
| KR | 10-358699 | 10/2002 |
| KR | 10-0398590 | 11/2002 |
| KR | 2002091455 * | 12/2002 |
| KR | 20020091693 A | 12/2002 |
| KR | 1020030021378 A | 3/2003 |
| KR | 1020030027302 A | 4/2003 |
| KR | 1020030057072 A | 7/2003 |

* cited by examiner

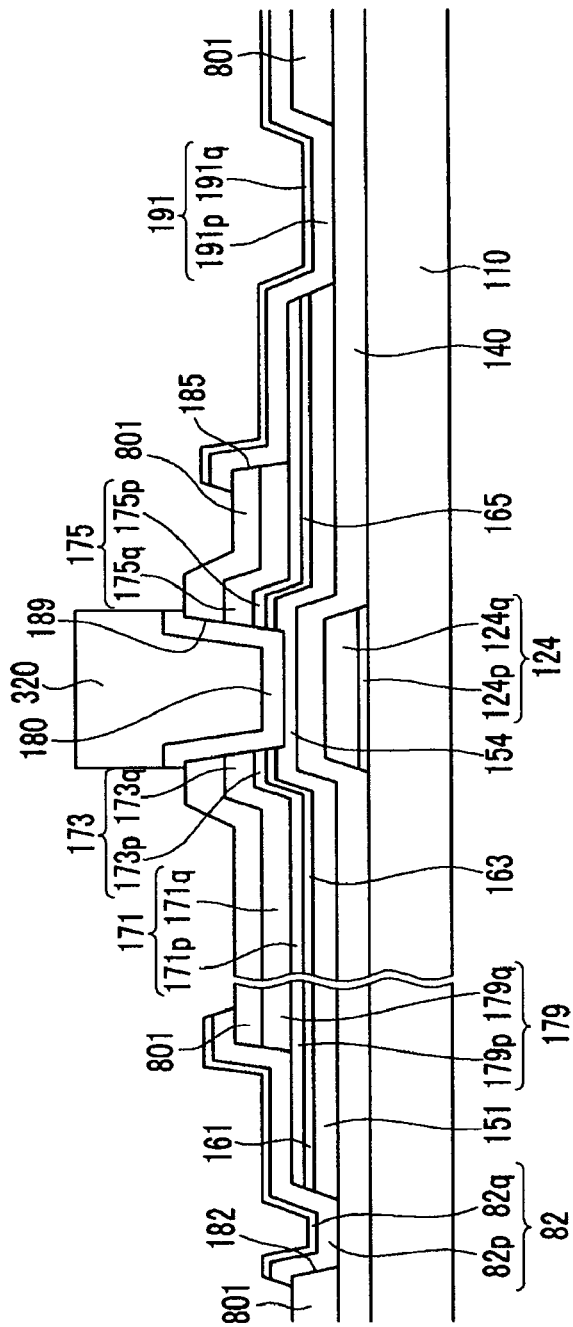

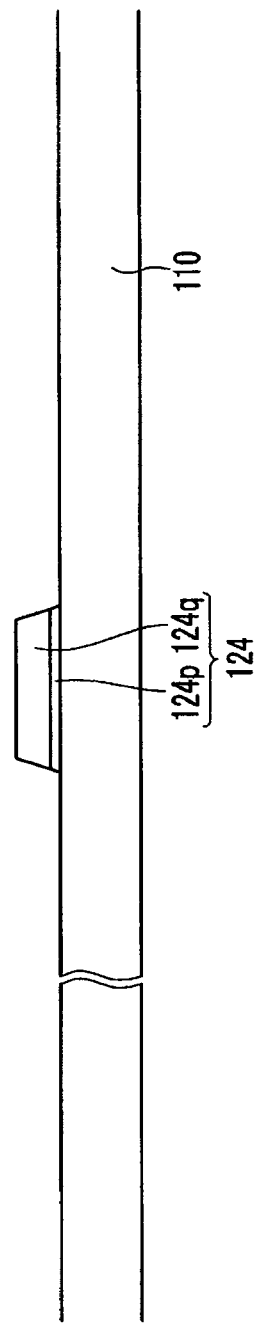

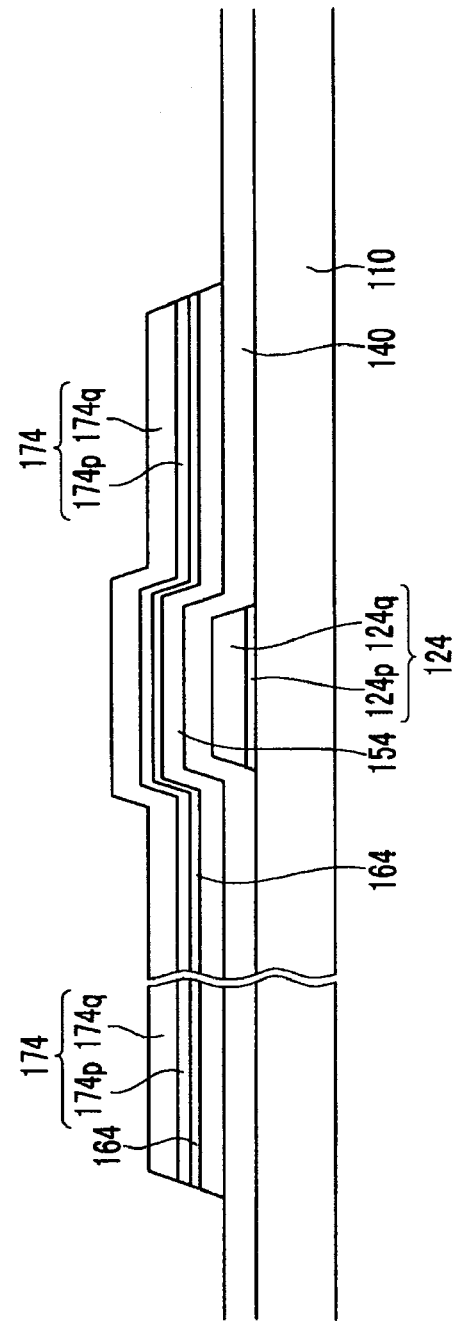

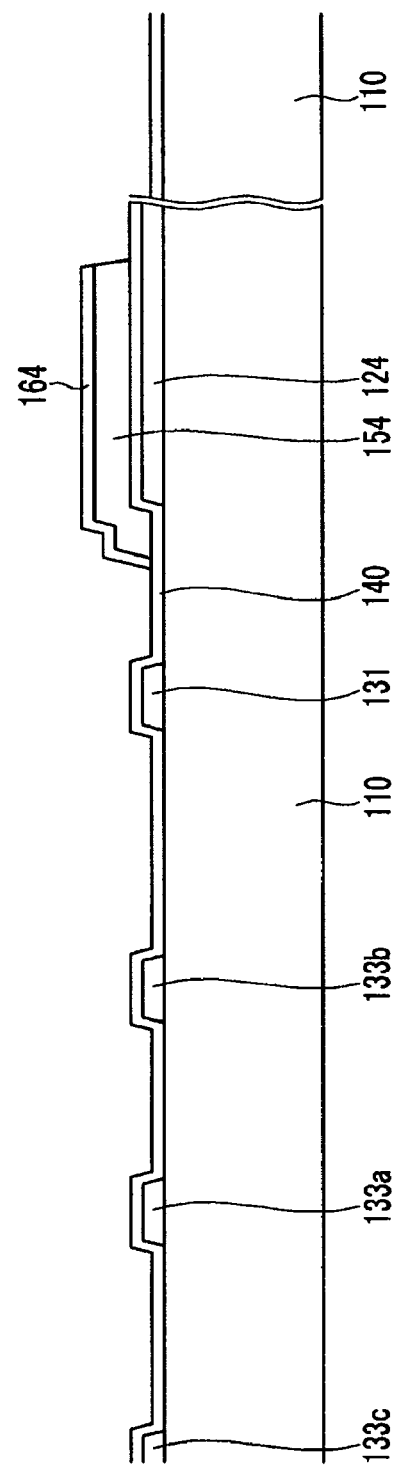

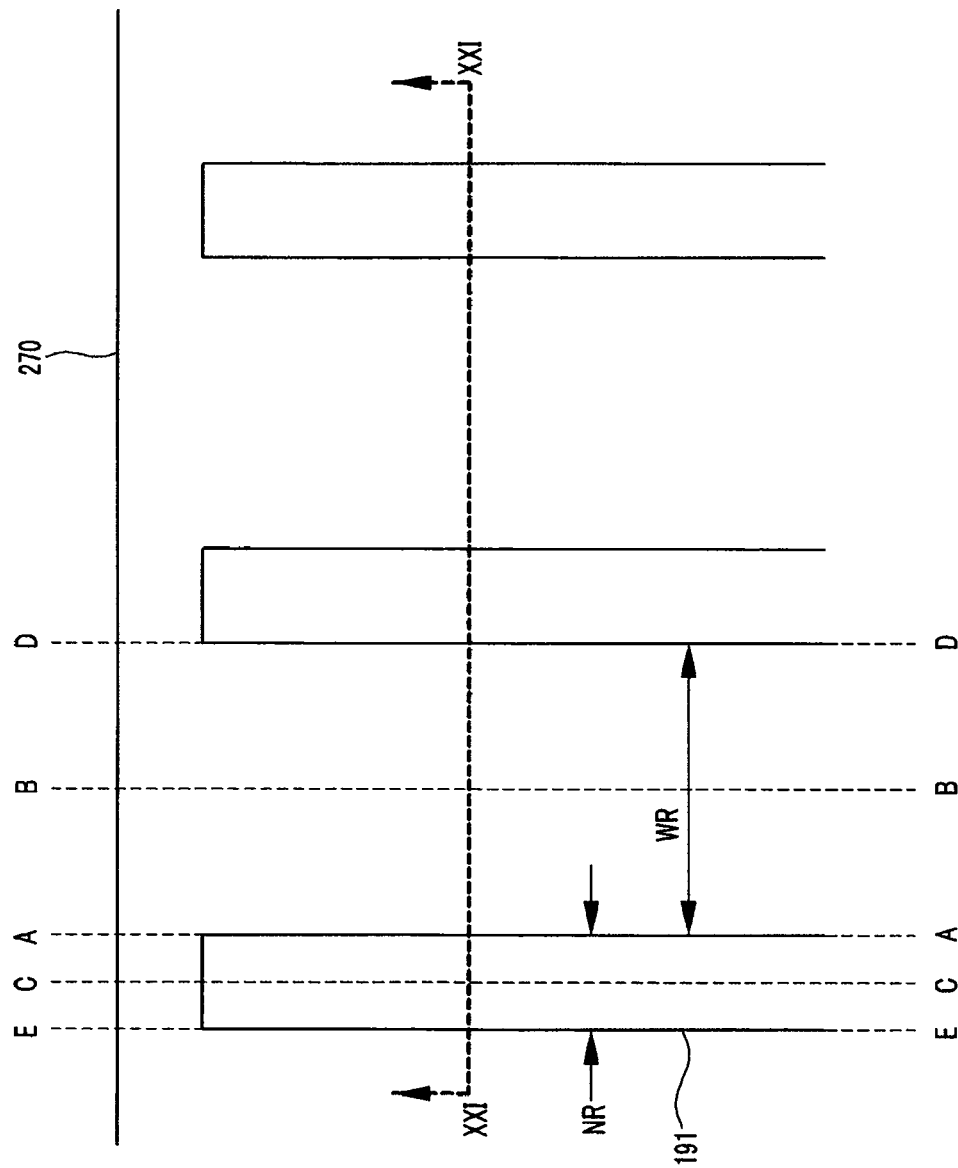

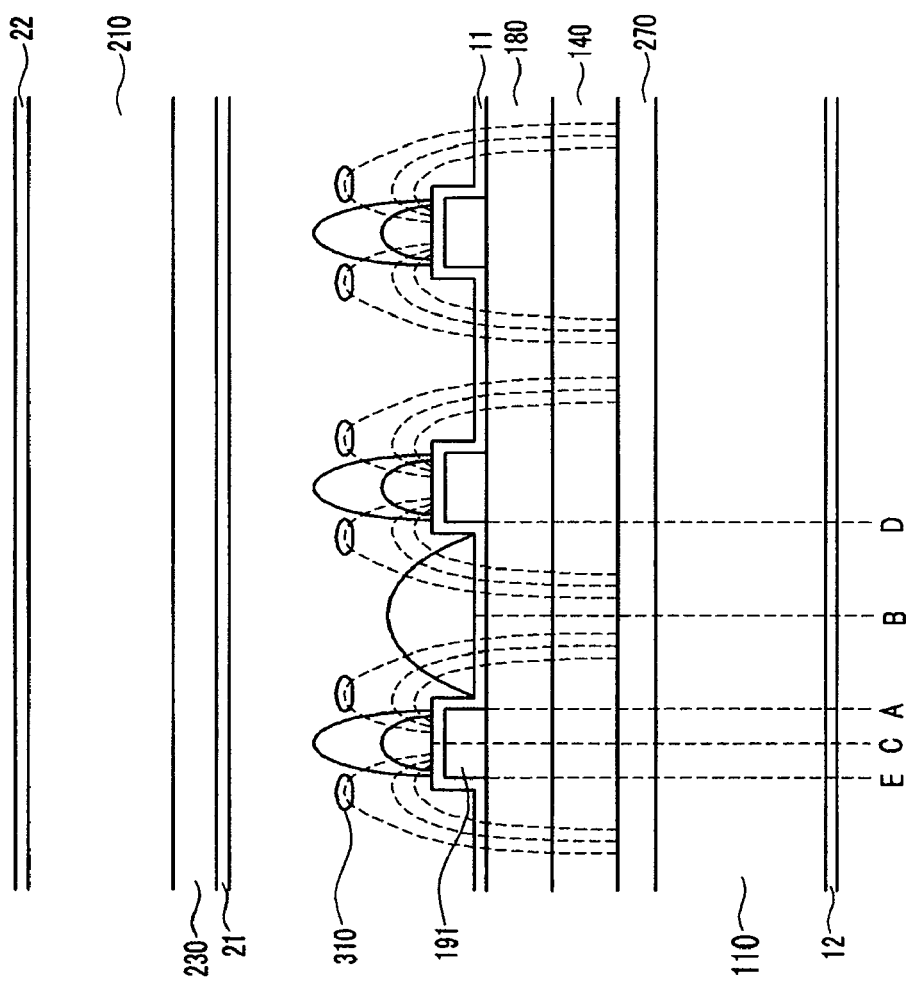

THIN FILM TRANSISTOR ARRAY PANEL AND MANUFACTURING METHOD THEREOF

CROSS REFERENCE TO RELATED APPLICATIONS

This application is a divisional patent application of U.S. patent application Ser. No. 13/204,553, filed Aug. 5, 2011, which is a divisional patent application of U.S. patent application Ser. No. 12/417,280, filed Apr. 2, 2009 (now U.S. Pat. No. 8,207,534), which is a divisional patent application of U.S. patent application Ser. No. 11/260,017, filed Oct. 26, 2005 (now U.S. Pat. No. 7,527,992), which claims priority from Korean Patent Application No. 10-2004-0085686 filed on Oct. 26, 2004 and Korean Patent Application No. 10-2005-0061832 filed on Jul. 8, 2005, the contents of each of which are incorporated by reference herein in their entireties.

BACKGROUND OF THE INVENTION (a) Field of the Invention

The present invention relates to a thin film transistor array panel and a manufacturing method thereof.

(b) Description of the Related Art

A liquid crystal display (LCD) is one of the most widely used flat panel displays. An LCD includes two panels provided with field-generating electrodes such as pixel electrodes and a common electrode, and a liquid crystal (LC) layer interposed therebetween. The LCD displays images by applying voltages to the field-generating electrodes to generate an electrical field in the LC layer, which determines orientations of LC molecules in the LC layer to adjust polarization of incident light.

Among LCDs including field-generating electrodes on respective panels, one kind of LCD provides a plurality of pixel electrodes arranged in a matrix on one panel, and a common electrode covering an entire surface of the other panel. The image display of the LCD is accomplished by applying individual voltages to the respective pixel electrodes. Application of the individual voltages is achieved by utilizing a plurality of three-terminal thin film transistors (TFTs) which are connected to the respective pixel electrodes. A plurality of gate lines is provided for transmitting control signals to the TFTs, and a plurality of data lines is provided for transmitting voltages to be applied to the pixel electrodes.

One panel for an LCD typically includes a layered structure having several conductive layers and insulating layers. Gate lines, data lines, and a pixel electrodes are formed from different conductors, and the insulating layers are interposed therebetween to insulate the different conductors from each other.

Typically, an $H_2$ cleaning process is used to protect the exposed channel portion of the semiconductor and to remove impurities remaining on the channel portion after forming the pixel electrode. However, the metal components of indium zinc oxide (IZO) or indium tin oxide (ITO) of the pixel electrode react when executing the $H_2$ cleaning process and this results in the formation of opaque metal particles. These metal particles adhere to the surface of the pixel electrode, which reduces the transmittance of the pixel.

To prevent this problem, the $H_2$ cleaning process is sometimes omitted. In this case, a leakage current is generated in the semiconductor, such that the electrical characteristics of the thin film transistor are deteriorated.

Furthermore, when silicon nitride ($SiN_x$) is deposited on an IZO or ITO transparent electrode, gases such as $H_2$ and $SiH_4$ are used, which results in the generation of opaque metal materials.

SUMMARY OF THE INVENTION

The present invention provides a thin film transistor array panel having good transmittance and a method for manufacturing the same.

The thin film transistor array panel includes a substrate, a gate line and a data line formed on the substrate and crossing each other, a thin film transistor connected to the gate line and the data line, and a pixel electrode connected to the thin film transistor, wherein the pixel electrode has a transparent conductive layer including nitrogen.

The transparent conductive layer may be made of ITON or IZON, and the pixel electrode may further include a conductive layer made of ITO or IZO.

The thin film transistor may include a gate electrode connected to the gate line, a gate insulating layer covering the gate electrode, a semiconductor layer formed on the gate insulating layer and overlapping the gate electrode, a source electrode formed on the semiconductor layer and connected to the data line, and a drain electrode formed on the semiconductor layer and corresponding to the source electrode with respect to the source electrode.

The thin film transistor array panel may further include an interlayer insulating layer covering the data line, the source electrode, and the drain electrode, and having an opening in the semiconductor layer between the source electrode and the drain electrode and a first contact hole exposing the drain electrode. The pixel electrode may be formed on the interlayer insulating layer and may contact the drain electrode via the first contact hole, and it may have a plurality of first portions with a linear shape and a second portion connecting the plurality of first portions to each other.

The thin film transistor array panel may further include a common electrode parallel to the first portion and arranged with the first portion in turn, or overlapping the first portion.

The data line, the source electrode, and the drain electrode may include a lower conductive layer and an upper conductive layer. A portion of the lower conductive layer of the drain electrode and a portion of the gate insulating layer adjacent to the exposed portion of the lower conductive layer are exposed through the first contact hole.

At least the boundary of the upper conductive layer of the drain electrode may coincide with the boundary of the first contact hole. The thin film transistor array panel may further include a passivation layer covering the opening, and it may further include an interval member formed on the passivation layer. The passivation layer may be made of silicon nitride, and the lower conductive layer may include chromium and the upper conductive layer may include aluminum.

A method of manufacturing a thin film transistor array panel includes forming a gate line on a substrate, depositing a gate insulating layer to cover the gate line, forming a semiconductor layer on the gate insulating layer, forming a data line and drain electrode on the gate insulating layer and the semiconductor layer, and forming a pixel electrode connected to the drain electrode. The pixel electrode is made of a transparent conductive material including nitrogen.

The method may further include cleaning the exposed portion of the semiconductor layer using $H_2$ after forming the pixel electrode.

The transparent conductive layer may be made of ITON or IZON, or it may be made of a double structure of indium tin oxide/indium tin oxide nitride (ITO/ITON) or indium zinc oxide/indium zinc oxide nitride (IZO/IZON).

A method of manufacturing a thin film transistor array panel includes forming a gate line on a substrate, sequentially depositing a gate insulating layer and an amorphous silicon layer on the gate line, depositing a lower conductive layer and an upper conductive layer on the amorphous silicon layer, patterning the lower conductive layer, the upper conductive layer, and the amorphous silicon layer to form a conductor and a semiconductor, forming an interlayer insulating layer on the conductor and the semiconductor, etching the interlayer insulating layer to expose first and second portions of the upper conductive layer of the conductor, removing the upper conductive layer of the first and the second portions to expose the lower conductive layer, removing the lower conductive layer of the second portion to complete a data line, a source electrode, and a drain electrode and to expose the portion of the semiconductor, forming a pixel electrode having a transparent conductive layer and being connected to the lower conductive layer of the first portion, $H_2$ cleaning the exposed semiconductor, and forming a first insulating layer covering the exposed semiconductor.

The method may further include forming a storage electrode line on the insulating substrate, and depositing a second insulating layer on the first insulating layer and etching the first and the second insulating layers to form an interval member and a passivation layer.

The first portion of the upper conductive layer and the gate insulating layer adjacent to the first portion may be exposed when etching the interlayer insulating layer, and the pixel electrode may cover the first portion of the lower conductive layer and the exposed gate insulating layer together. The lower conductive layer may include chromium and the upper conductive layer may include aluminum.

The amorphous silicon layer may include an extrinsic amorphous silicon layer and an intrinsic amorphous silicon layer, and the exposed portion of the extrinsic amorphous silicon layer may be removed after removing the lower conductive layer. The transparent conductive layer may be made of ITON or IZON, or may be made of double structure of ITO/ITON or IZO/IZON. The ITON or the IZON may be formed using a nitrification process of ITO or IZO, and the thickness of the ITON and the IZON may be in the range of 50-100 Å.

A thin film transistor array panel includes a substrate, a plurality of gate lines formed on the substrate, a plurality of common electrodes having a transparent conductive layer on the substrate, a gate insulating layer covering the gate lines and the common electrodes, a plurality of semiconductor layers formed on the gate insulating layer, a plurality of data lines including a plurality of source electrodes and formed on the semiconductor layer and the gate insulating layer, a plurality of drain electrodes formed on the semiconductor layer and the gate insulating layer, and a plurality of pixel electrodes overlapping the common electrodes and connected to the drain electrodes. The common electrodes may have a continuous surface between the pixel electrodes.

The transparent conductive layer may be made of ITON, IZON, or amorphous indium tin oxide nitride (a-ITON), and the thickness thereof may be in the range of from about 10-3,000 angstroms. The transparent conductive layer may alternately be made of a double layer structure of ITO/ITON, IZO/IZON, or amorphous indium tin oxide/amorphous tin oxide nitride (a-ITO/a-ITON), and the thickness of the ITON, the IZON and a-IT may be in the range of from about 50-1, 000 angstroms. The nitrogen content of the ITON, the IZON, and a-ITON may be in the range of 0.001-90 atomic percent.

The semiconductor layers except for the portion between the source electrodes and the drain electrodes may have the same planar shapes as the data lines and the drain electrodes. At least one pixel may include one common electrode and one pixel electrode, and the common electrodes of adjacent pixels may be connected to each other.

Electrical fields are formed by the thin film transistor array panel, and the electrical fields form electrical lines of force with parabolic shapes, and the electrical lines of force may include a vertical component and a horizontal component.

The interval between the pixel electrodes may be equal to or larger than the width of the pixel electrodes, and the pixel electrodes and the common electrodes may form a storage capacitor by overlapping each other.

A method of manufacturing a thin film transistor array panel includes forming a gate line on a substrate, forming a common electrode having a transparent conductive layer on the substrate, depositing a gate insulating layer covering the gate line and the common electrode, forming a semiconductor layer on the gate insulating layer, forming a data line and drain electrode on the gate insulating layer and the semiconductor layer, and forming a pixel electrode connected to the drain electrode. The pixel electrode and the common electrode at least overlap each other.

The transparent conductive layer is made of ITON, IZON, or a-ITON, which may be formed by sputtering ITO, IZO, or a-ITO under a nitrogen atmosphere. The thickness of the ITON, IZON, or a-ITON is in the range of 10-3,000 angstroms.

The transparent conductive layer may alternately be made of a double layer structure of ITO/ITON, IZO/IZON, or a-ITO/a-ITON. The formation of the double layer structure of ITO/ITON, IZO/IZON, or a-ITO/a-ITON may include forming a first conductive layer of ITO, IZO, or a-ITO, and forming a second layer of ITON, IZON, or a-ITON through reaction sputtering while injecting nitrogen gas. The formation of the double layer structure of ITO/ITON, IZO/IZON, or a-ITO/a-ITON may alternately include forming a first conductive layer of ITO, IZO, or a-ITO, and forming a second layer of ITON, IZON, or a-ITON with $NH_3$ plasma. The thickness of the ITON, the IZON, and a-ITON is in the range of 50-1,000 angstroms.

A method of manufacturing a thin film transistor array panel includes forming a transparent conductive layer, nitrifying the transparent conductive layer, and depositing an insulating layer on the transparent conductive layer.

BRIEF DESCRIPTION OF THE DRAWINGS

The present invention will become more apparent by describing embodiments thereof in detail with reference to the accompanying drawings, in which:

FIGS. 2A and 2B are sectional views of the TFT array panel shown in FIG. 1 taken along the lines IIA-IIA and IIB-IIB, respectively;

FIGS. 4A and 4B are sectional views of the TFT array panel shown in FIG. 3 taken along the lines IVA-IVA and IVB-IVB, respectively;

FIGS. 6A and 6B are sectional views of the TFT array panel shown in FIG. 5 taken along the lines VIA-VIA and VIB-VIB, respectively;

FIG. 16B is a sectional view of the TFT array panel shown in FIG. 16A taken along the lines XVIB-XVIB'-XVIB";

FIG. 20 is a layout view of electrodes of the TFT array panel for the liquid crystal display (LCD) according to another embodiment of the present invention;

FIG. 21 is a cross-sectional view taken along line XXI-XXI in FIG. 20, which shows both upper and lower panels as well as electrical lines of force between the two panels;

DETAILED DESCRIPTION OF EMBODIMENTS

Figure 1:
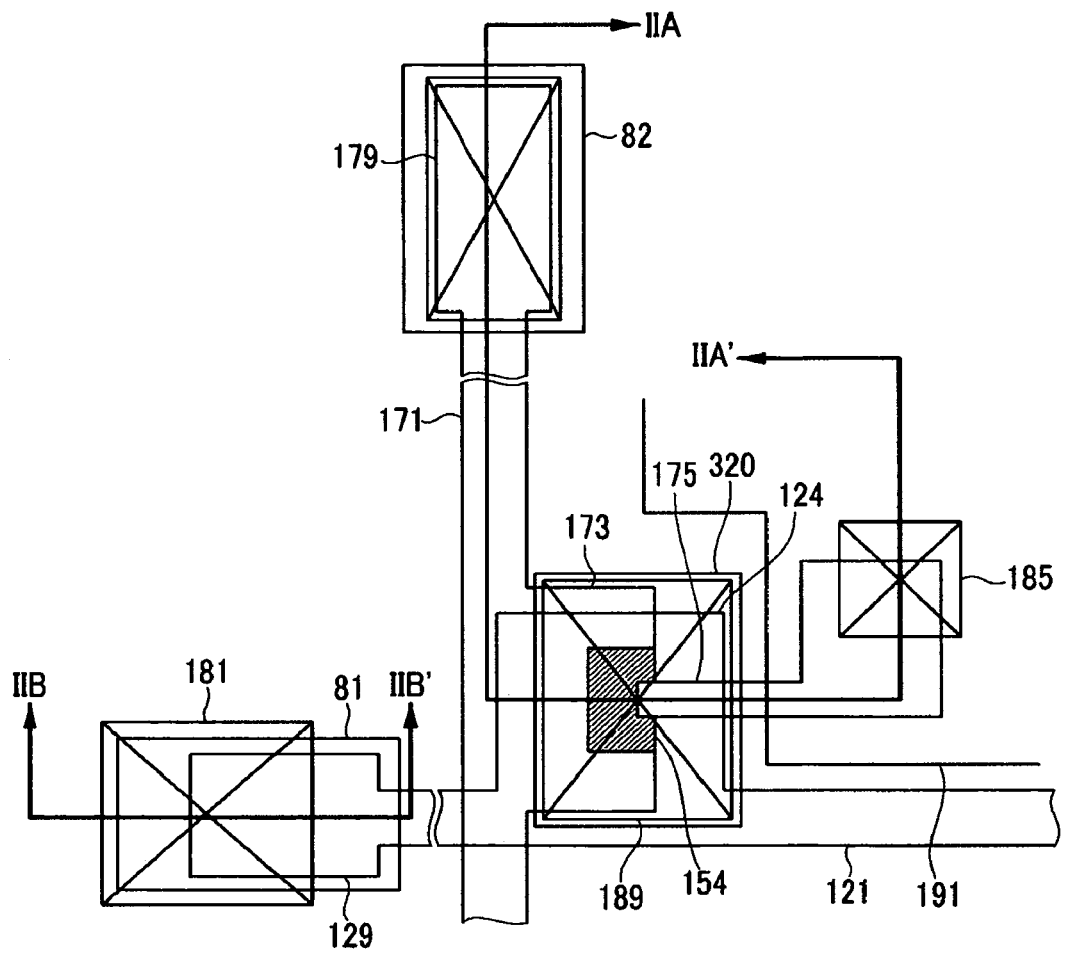
FIG. 1 is an exemplary layout view of a TFT array panel according to an embodiment of the present invention.

The present invention will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

A TFT array panel for an LCD is described below in detail with reference to FIGS. 1 to 2B.

Figure 2B:
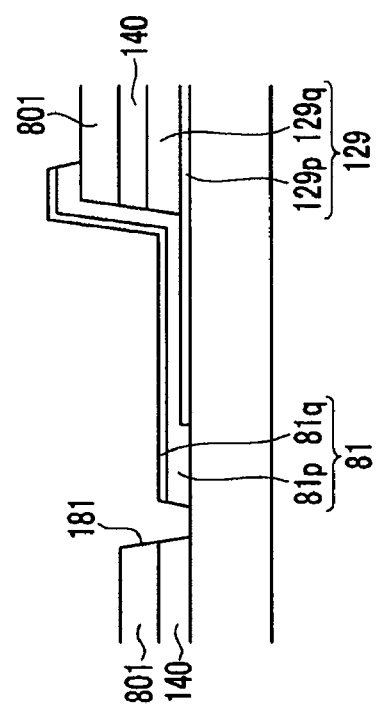

FIG. 1 is a layout view of a TFT array panel according to an embodiment of the present invention, and FIGS. 2A and 2B are sectional views of the TFT array panel shown in FIG. 1 taken along the lines IIA-IIA and IIB-IIB, respectively.

A plurality of gate lines 121 for transmitting gate signals are formed on an insulating substrate 110.

Each gate line 121 extends substantially in a transverse direction and it includes a plurality of portions projecting upward to form a plurality of gate electrodes 124 and an expanded end portion 129 having a large area for contact with another layer or an external device.

The gate lines 121 include two layers having different physical characteristics, i.e., a lower layer and an upper layer. The upper layer is preferably made of a low resistivity metal such as an Al-containing metal such as Al and an Al alloy for reducing signal delay or voltage drop in the gate lines 121. The lower layer is preferably made of a material such as an Mo-containing metal such as Mo and an Mo alloy, Cr, Ta, or Ti, which has good physical, chemical, and electrical contact characteristics with other materials such as indium tin oxide (ITO) and indium zinc oxide (IZO). Good examples of combinations of the lower layer material and the upper layer material are Cr and Al and Cr and an Al—Nd alloy, which are etched under different etch conditions. In FIGS. 2A and 2B, the lower and upper layers of the gate electrodes 124 are indicated by reference numerals 124$p$ and 124$q$, respectively, and the lower and upper layers of the end portions 129 are indicated by reference numerals 129$p$ and 129$q$, respectively. Portions of the upper layer 129$q$ of the end portions 129 of the gate lines 121 are removed to expose the underlying portions of the lower layers 129$p$, and thus there is at least an edge of the upper layer 129$q$ disposed on the lower layer 129$p$.

The lateral sides of the gate lines 121 are inclined relative to a surface of the substrate 110, and a gate insulating layer 140 preferably made of silicon nitride (SiNx) is formed on the gate lines 121.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124.

A plurality of ohmic contact stripes and islands 161 and 165 preferably made of silicide or n+hydrogenated a-Si heavily doped with an N-type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range of about 30-80 degrees.

A plurality of data lines 171 and a plurality of drain electrodes 175 are formed on the ohmic contacts 161 and 165.

The data lines 171 for transmitting data voltages extend substantially in the longitudinal direction and intersect the gate lines 121. Each data line 171 includes an expanded end portion 179 having a larger area for contact with another layer or an external device.

A plurality of branches of each data line 171, which project toward the drain electrodes 175, form a plurality of source electrodes 173. Each drain electrode 175 includes one linear end portion disposed on a gate electrode 124 and partially enclosed by a source electrode 173, and the other expanded end portion has a large area for contact with another layer. A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 respectively include a lower layer 171$p$ and 175$p$ and an upper layer 171$q$ and 175$q$ located thereon. Good examples of combinations of the lower layer material and the upper layer material are Cr and Al and Cr and an Al—Nd alloy, which are etched under different etch conditions. In FIGS. 2A and 2B, the lower and upper layers of the source electrodes 173 are indicated by reference numerals 173$p$ and 173$q$, respectively, and the lower and upper layers of the end portions 179 are indicated by reference numerals 179$p$ and 179$q$, respectively. In addition, portions of the lower layer 175$p$ of the expanded end portions of the drain electrodes 175 and portions of the lower layer 179$p$ of the end portions 179 of the data lines 171 are also exposed, and thus there is at least an edge of the upper layer 175$q$/179$q$ disposed on the lower layer 175$p$/179$p$.

Like the gate lines 121, the data lines 171 and the drain electrodes 175 have tapered lateral sides relative to a surface of the substrate 110, and the inclination angles thereof range about 30-80 degrees.

The ohmic contacts 161 and 165 are interposed only between the underlying semiconductor stripes 151 and the overlying data lines 171 and the overlying drain electrodes 175 thereon, and reduce the contact resistance therebetween. The semiconductor stripes 151 have almost the same planar shapes as the data lines 171 and the drain electrodes 175 as well as the underlying ohmic contacts 161 and 165. However, the projections 154 of the semiconductor stripes 151 include a plurality of exposed portions, which are not covered with the data lines 171 and the drain electrodes 175, such as portions located between the source electrodes 173 and the drain electrodes 175.

An interlayer insulating layer 801 is formed on the data lines 171, the drain electrodes 175, and exposed portions of the semiconductor stripes 151, which are not covered with the data lines 171 and the drain electrodes 175. The interlayer insulating layer 801 is preferably made of a photosensitive organic material having a good flatness characteristic, a low dielectric insulating material such as a-Si:C:O and a-Si:O:F formed by plasma enhanced chemical vapor deposition (PECVD), or an inorganic material such as silicon nitride and silicon oxide.

The interlayer insulating layer 801 has a plurality of contact holes 182 and 185 exposing the end portions 179 of the data lines 171 and the drain electrodes 175, respectively. The interlayer insulating layer 801 and the gate insulating layer 140 have a plurality of contact holes 181 exposing the end portions 129 of the gate lines 121. Furthermore, the interlayer insulating layer 801 has a plurality of openings 189 exposing the exposed portions of the projections 154 of the semiconductor stripes 151 in the TFTs.

The contact holes 181, 182, and 185 expose the lower layers 129$p$, 179$p$, and 175$p$. The edges of the upper layers 129$q$, 179$q$, and 175$q$ disposed on the lower layers 129$p$, 179$p$, and 175$p$ substantially coincide with boundaries of the contact holes 181, 182, and 185. In addition, the contact holes 181 expose edges of the end portions 129 of the gate lines 121 and some portions of the substrate 110, and the contact holes 182/185 expose edges of the end portions 179 of the data lines 171/the drain electrodes 175 and some portions of the gate insulating layer 140.

A plurality of pixel electrodes 191 and a plurality of contact assistants 81 and 82, which are preferably made of transparent material such as IZO, are formed on the interlayer insulating layer 801.

The pixel electrodes 191 are physically and electrically connected to the drain electrodes 175 through the contact holes 185 such that the pixel electrodes 191 receive the data voltages from the drain electrodes 175. The pixel electrodes 191 fully cover the exposed portions of the drain electrodes 175. The pixel electrode 191 may be a single layer made of indium zinc oxide nitride (IZON) or indium tin oxide nitride (ITON), or include two layers having a lower layer 191*p* made of IZO or ITO and an upper layer 191*q* made of IZON or ITON.

Furthermore, when the interlayer insulating layer 801 is made of a low dielectric insulating material, the boundary of the pixel electrode 191 may be disposed on the gate line 121 and the data line 171.

The pixel electrodes 191 are supplied with the data voltages and generate electrical fields in cooperation with a common electrode (not shown) on another panel (not shown), which reorient liquid crystal molecules in a liquid crystal layer (not shown) disposed therebetween.

A pixel electrode 191 and a common electrode form a liquid crystal capacitor, which stores applied voltages after turn-off of the TFT. An additional capacitor called a "storage capacitor," which is connected in parallel to the liquid crystal capacitor, may be provided for enhancing the voltage storing capacity. The storage capacitors are implemented by overlapping the pixel electrodes 191 with the gate lines 121 adjacent thereto (called "previous gate lines") or with separately provided storage electrodes (not shown). The capacitances of the storage capacitors, i.e., the storage capacitances, are increased by increasing overlapping areas or by providing conductors, which are connected to the pixel electrodes 191 and overlap the gate lines 121 or the storage electrodes, under the pixel electrodes 191 for decreasing the distance between the terminals.

The contact assistants 81 and 82 are connected to the exposed expanded end portions 129 and 179 of the gate lines 121 and the data lines 171 through the contact holes 181 and 182, and the contact assistants 81 and 82 fully cover the exposed expanded end portions 129 and 179. The contact assistants 81 and 82 protect the exposed portions 129 and 179 and complement the adhesion between the exposed end portions 129 and 179 and external devices.

The exposure of the edges of the lower layers 129*p*, 179*p*, and 175*p* of the end portions 129 of the gate lines 121, the end portions 179 of the data lines 171, and the expanded end portions of the drain electrodes 175 through the contact holes 181, 182, and 185 prevents the disconnection of the contact assistants 81 and 82 and the pixel electrodes 191 at the contact holes 181, 182, and 185. For example, portions of the pixel electrodes 191 near an edge of the contact hole 185 disposed on the lower layer 175*p* may be disconnected due to the undercut of the upper layer 175*q* at the edge of the contact hole 185. The undercut means that a portion of the upper layer 175*q* under the passivation layer 180 at the edge of the contact hole 185 is removed to place the boundary of the upper layer 175*q* under the passivation layer 180 such that the sidewall of the contact hole 185 has a hole or a depression as shown in FIG. 2A. However, the other edge of the contact hole 185 disposed directly on the gate insulating layer 140 does not have such undercut. Accordingly, the pixel electrodes 191 contact the drain electrodes 175 with a smooth profile, thereby securing the reliable contact therebetween.

A passivation layer 180 made of an inorganic insulator such as silicon nitride or silicon oxide is formed on the exposed portions of the projections 154 of the semiconductor stripes 151 and the interlayer insulating layer 801, and a plurality of interval members 320 having the same planar shapes as the passivation layer 180 is formed on the passivation layer 180. The interval members 320 support the two panels of the liquid crystal display such that they have a uniform interval therebetween:

A method of manufacturing the TFT array panel shown in FIGS. 1 to 2B according to an embodiment of the present invention will be now described in detail with reference to FIGS. 3 to 12B as well as FIGS. 1 to 2B.

Figure 3:
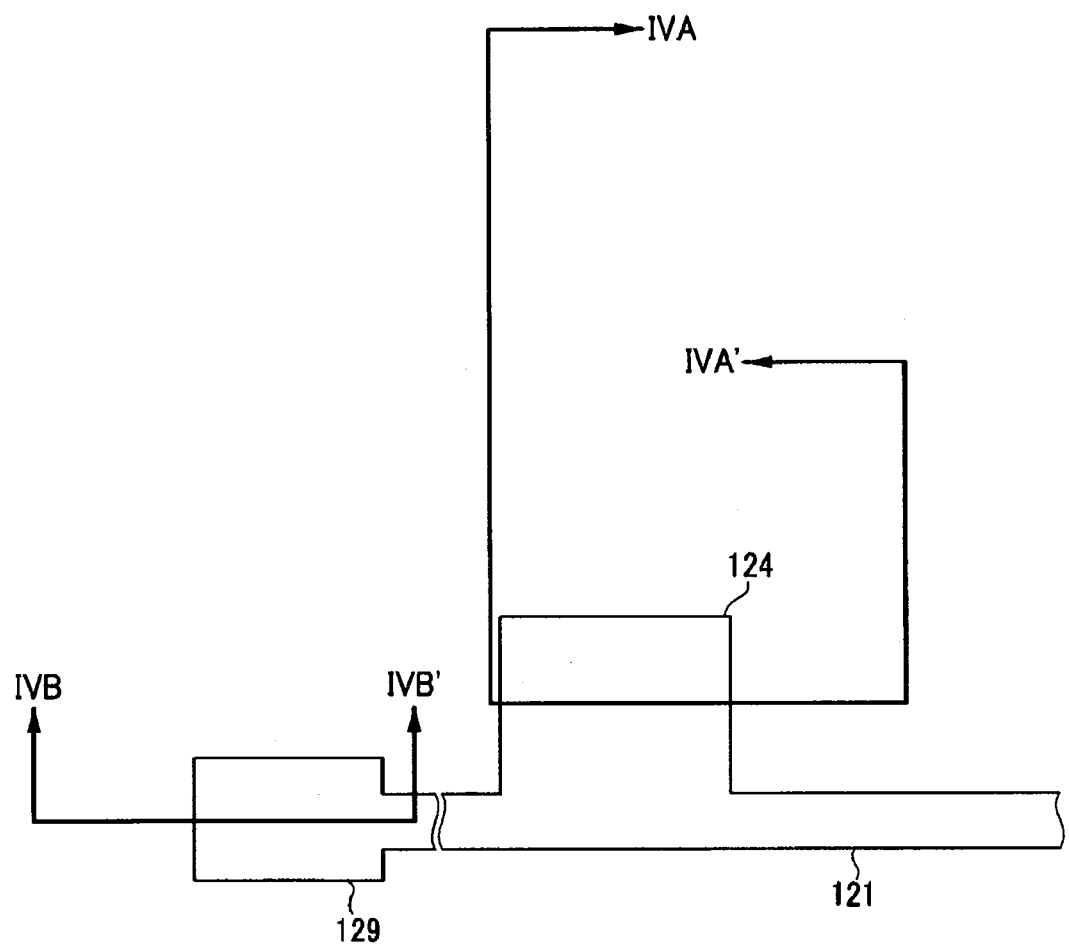
FIG. 3 is a layout view of a TFT array panel shown in FIGS. 1 to 2B in the first step of a manufacturing method thereof according to an embodiment of the present invention.
Figure 4B:
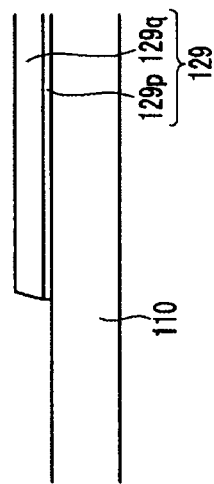
Figure 5:
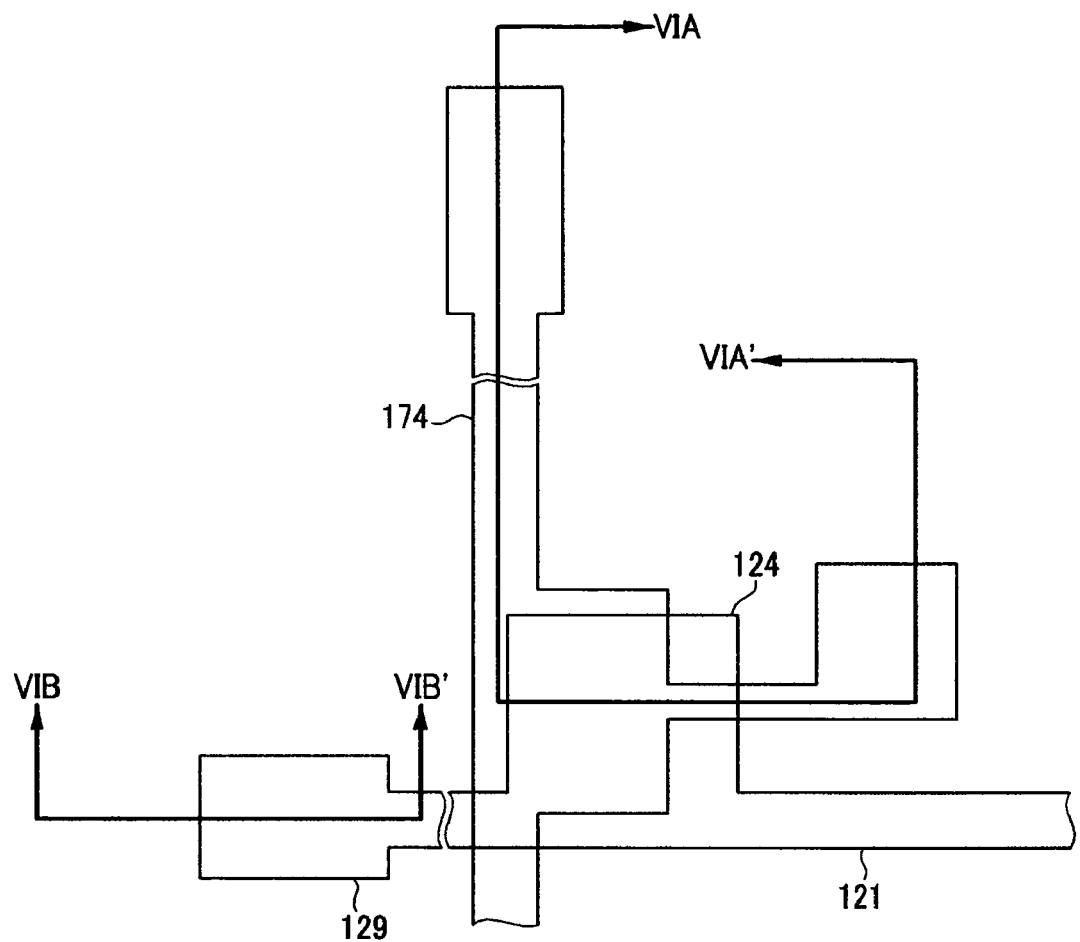
FIG. 5 is a layout view of the TFT array panel in the step following the step shown in FIGS. 3 to 4B.
Figure 6B:
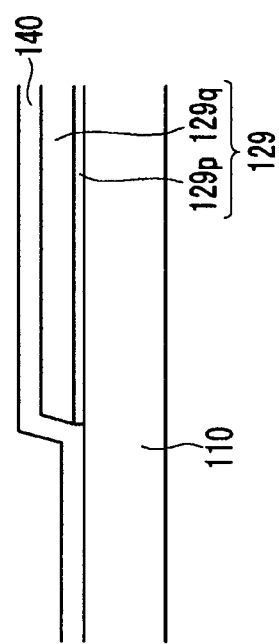
Figure 7:
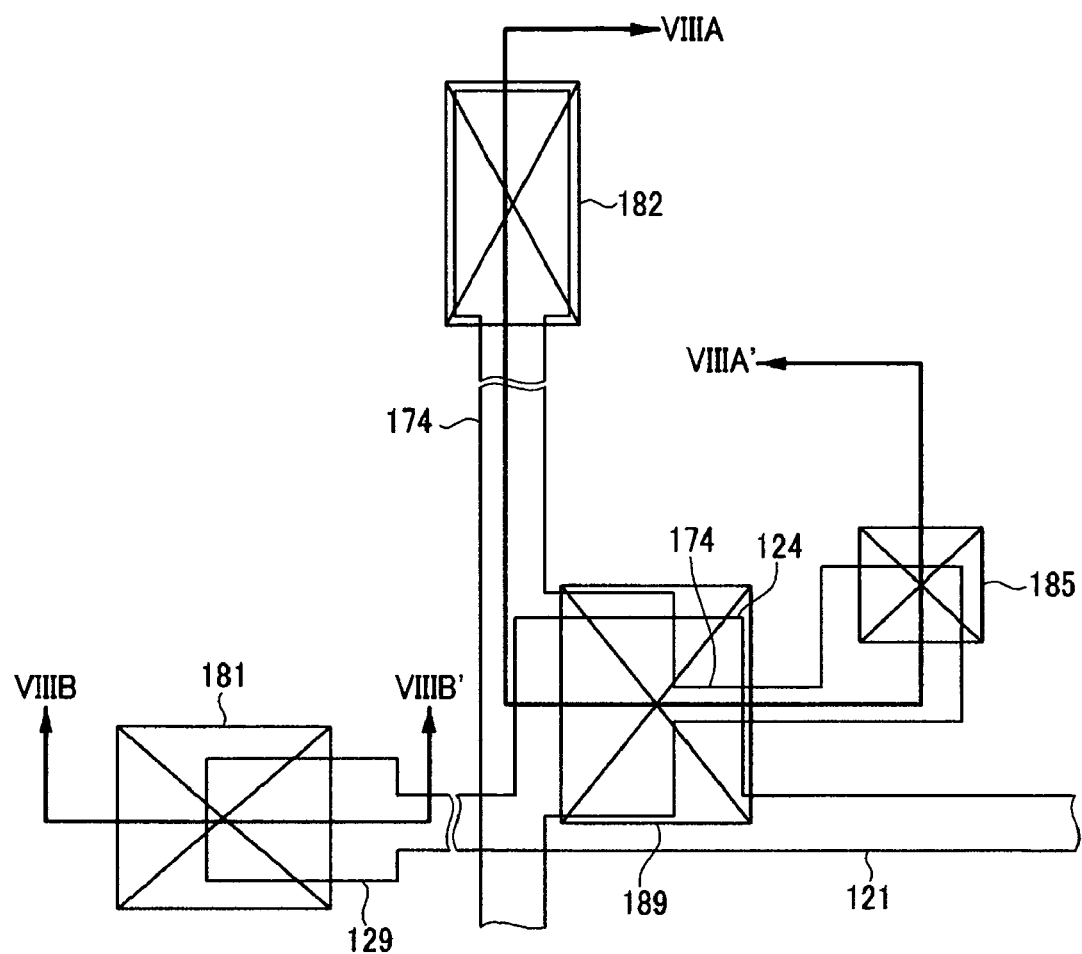
FIG. 7 is a layout view of the TFT array panel in the step following the step shown in FIGS. 5 to 6B.
Figure 8A:
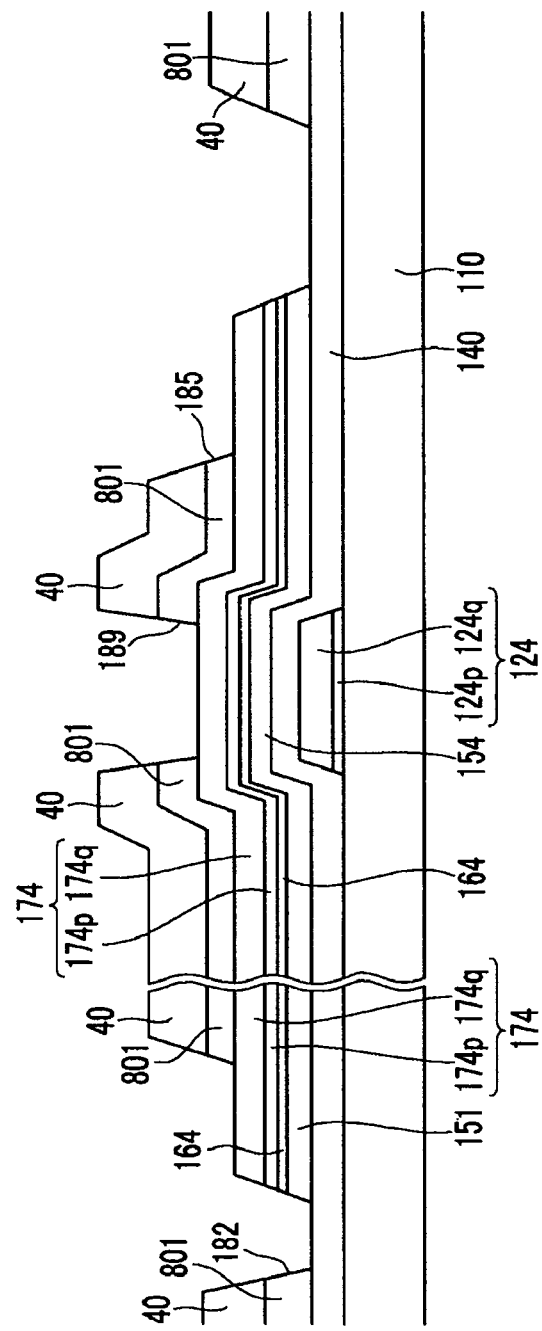
FIGS. 8A and 8B are sectional views of the TFT array panel shown in FIG. 7 taken along the lines VIIIA-VIIIA and VIIIB-VIIIB, respectively.
Figure 8B:
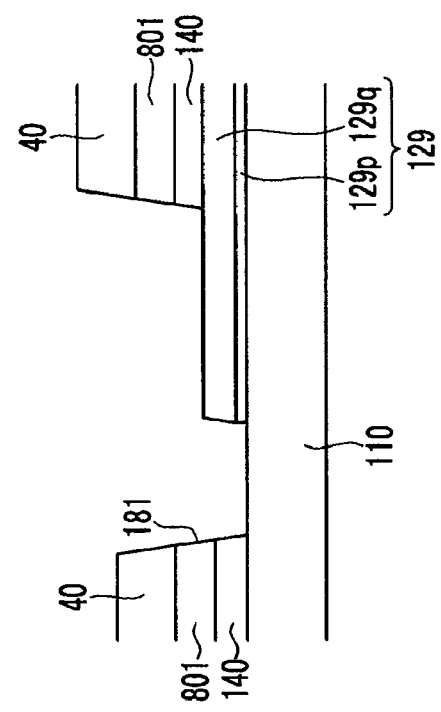
Figure 9A:
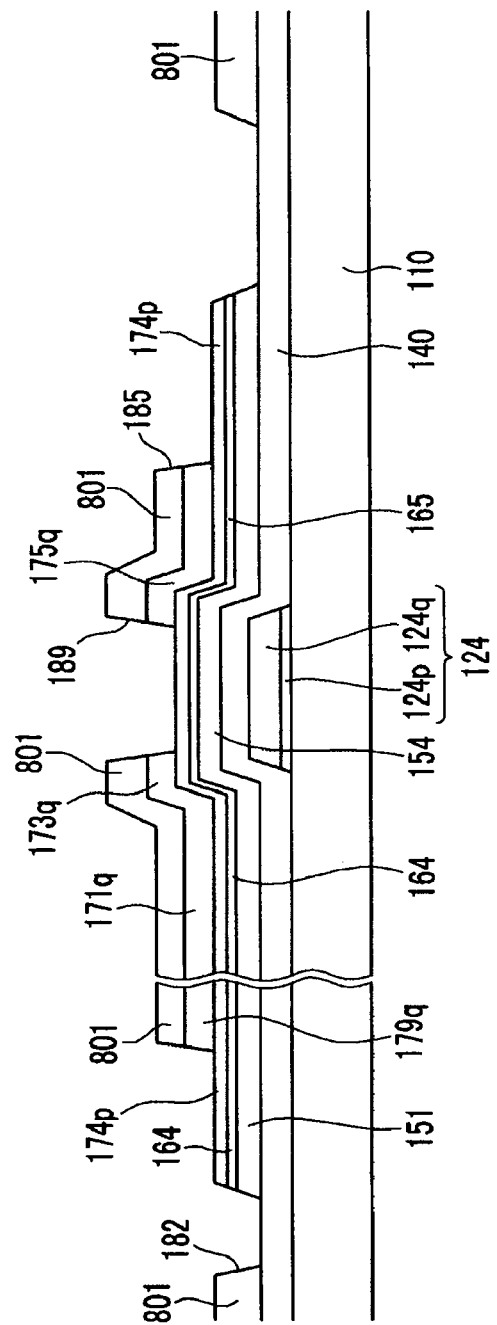
FIGS. 9A and 9B are sectional views of the TFT array panel shown in FIG. 7 taken along the lines VIIIA-VIIIA and VIIIB-VIIIB, respectively, and illustrate the step following the step shown in FIGS. 8A and 8B.
Figure 9B:
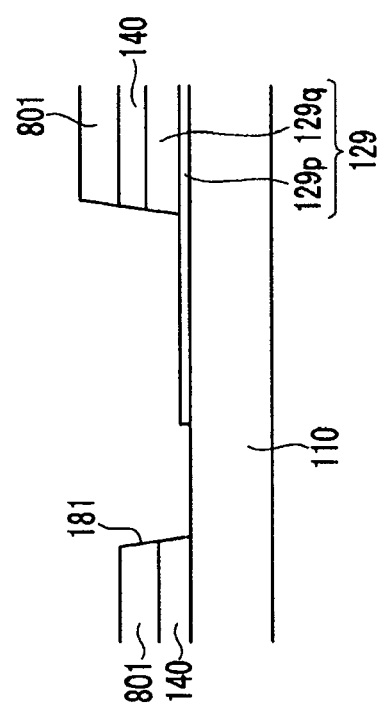
Figure 10:
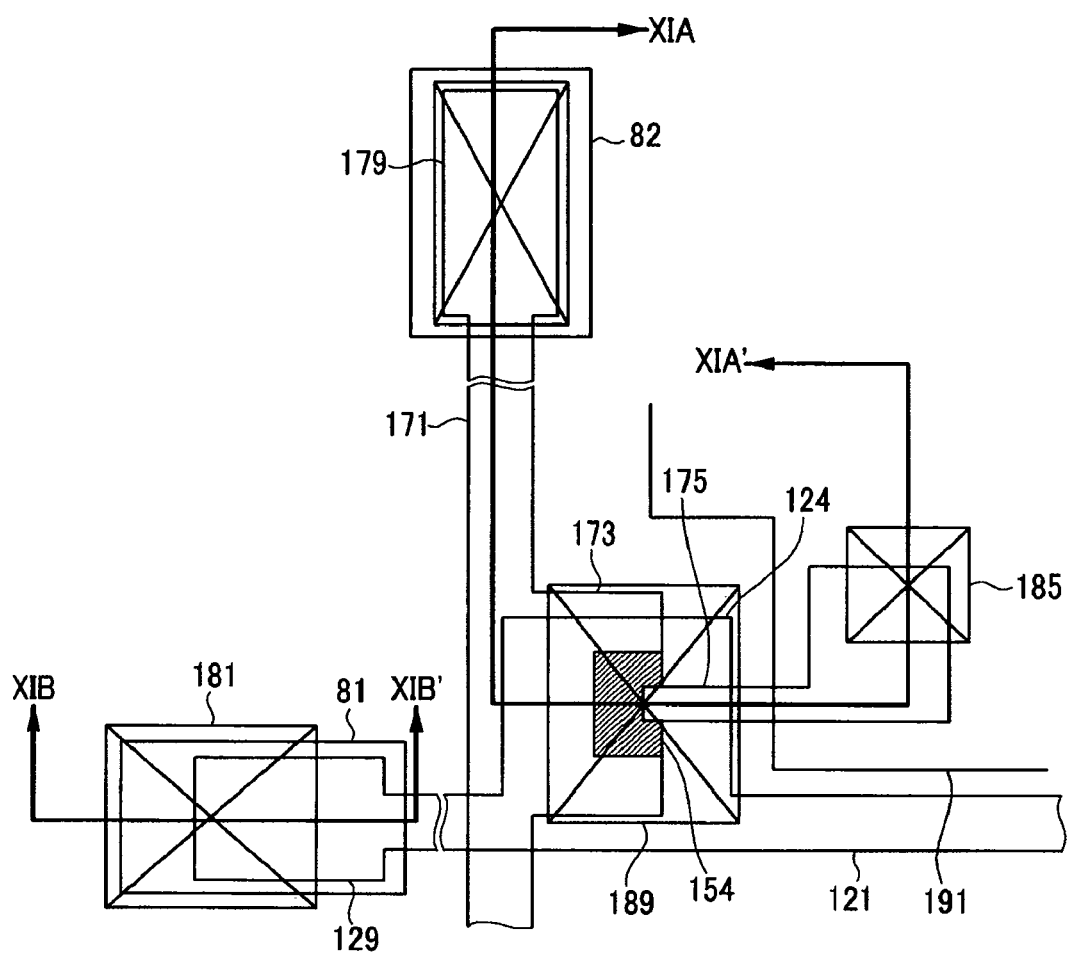
FIG. 10 is a layout view of the TFT array panel in the step following the step shown in FIGS. 9A and 9B.
Figure 11A:
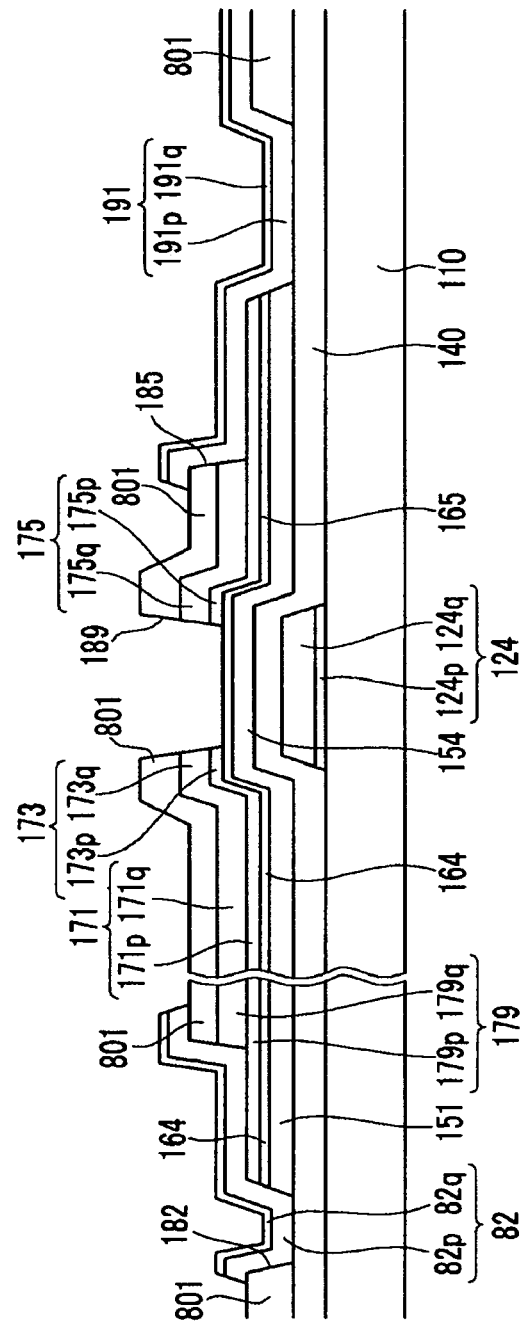
FIGS. 11A and 11B are sectional views of the TFT array panel shown in FIG. 10 taken along the lines XIA-XIA and XIB-XIB, respectively.
Figure 11B:
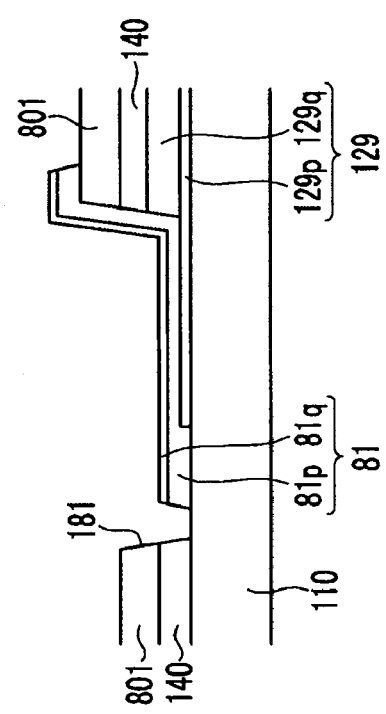
Figure 12A:
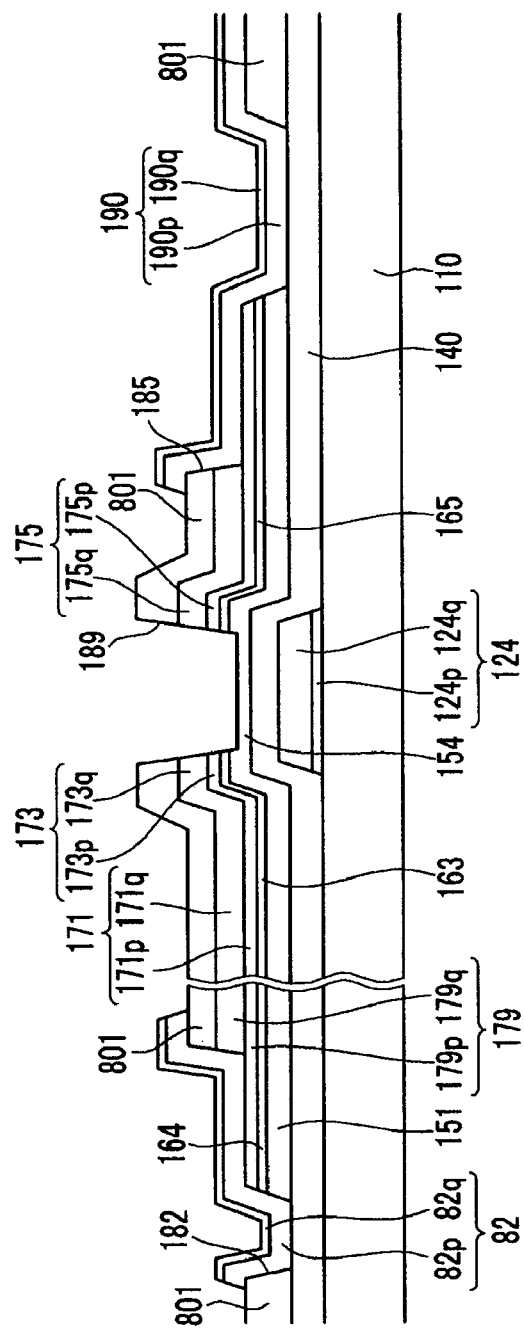
FIGS. 12A and 12B are sectional views of the TFT array panel shown in FIG. 10 taken along the lines XIA-XIA and XIB-XIB, respectively, and illustrate the step following the step shown in FIGS. 11A and 11B.
Figure 12B:
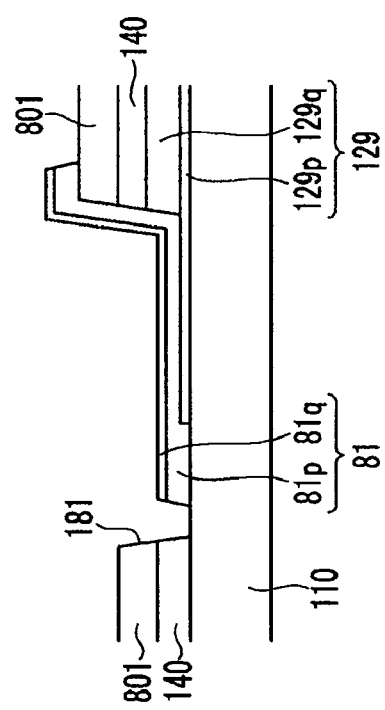

FIG. 3 is a layout view of a TFT array panel shown in FIGS. 1 to 2B in the first step of a manufacturing method thereof according to an embodiment of the present invention; FIGS. 4A and 4B are sectional views of the TFT array panel shown in FIG. 3 taken along the lines IVA-IVA and IVB-IVB, respectively; FIG. 5 is a layout view of the TFT array panel in the step following the step shown in FIGS. 3 to 4B; FIGS. 6A and 6B are sectional views of the TFT array panel shown in FIG. 5 taken along the lines VIA-VIA and VIB-VIB, respectively; FIG. 7 is a layout view of the TFT array panel in the step following the step shown in FIGS. 5 to 6B; FIGS. 8A and 8B are sectional views of the TFT array panel shown in FIG. 7 taken along the lines VIIIA-VIIIA and VIIIB-VIIIB, respectively; FIGS. 9A and 9B are sectional views of the TFT array panel shown in FIG. 7 taken along the lines VIIIA-VIIIA and VIIIB-VIII, respectively, and illustrate the step following the step shown in FIGS. 8A and 8B; FIG. 10 is a layout view of the TFT array panel in the step following the step shown in FIGS. 9A and 9B; FIGS. 11A and 11B are sectional views of the TFT array panel shown in FIG. 10 taken along the lines XIA-XIA and XIB-XIB, respectively; and FIGS. 12A and 12B are sectional views of the TFT array panel shown in FIG. 10 taken along the lines XIA-XIA and XIB-XIB, respectively, and illustrate the step following the step shown in FIGS. 11A and 11B.

Referring to FIGS. 3 to 4B, a plurality of gate lines 121 including a plurality of gate electrodes 124 are formed on an insulating substrate 110 made of a material such as transparent glass. The gate lines 121 include two conductive layers, i.e., a lower conductive layer preferably made of Cr and having a thickness of about 500 Å and an upper conductive layer preferably made of Al and having a thickness of about 1,000-3,000 Å, preferably about 2,500 Å.

At this time, when directly forming a gate driving circuit on the substrate, the portions of the gate driving circuit on the same layer as the gate lines 121 may be formed.

Referring to FIGS. 5 to 6B, a gate insulating layer 140, an intrinsic a-Si layer, an extrinsic a-Si layer, and a conductive layer including a lower conductive layer and an upper conductive layer are deposited in sequence by CVD and sputtering, and the conductive layer, the extrinsic a-Si layer, and the intrinsic a-Si layer are photo-etched to form a plurality of conductors 174 including upper and lower conductors 174*q* and 174*p*, a plurality of extrinsic semiconductor stripes 164, and a plurality of intrinsic semiconductor stripes 151 including a plurality of projections 154 on the gate insulating layer 140.

The gate insulating layer 140 is preferably made of silicon nitride with a thickness of about 2,000 Å to about 5,000 Å, and the deposition temperature is preferably in a range of about 250-500° C. The intrinsic a-Si layer and the extrinsic a-Si layer have thicknesses of about 500-1,500 Å and 300-600 Å, respectively. The lower conductive layer is preferably made of Cr and has a thickness of about 500 Å, and the upper conductive layer is preferably made of Al and has a thickness of about 1,000-3,000 Å, preferably about 2,500 Å. The sputtering target for the upper conductive layer is preferably Al or Al—Nd containing about 2 atomic percent of Nd, and the sputtering temperature is about 150° C.

Referring to FIGS. 7 to 8B, an interlayer insulating layer 801 preferably having a thickness larger than about 3,000 Å is deposited, and a photoresist 40 is formed. The interlayer insulating layer 801 and the gate insulating layer 140 are etched using the photoresist 40 as an etch mask to form a plurality of contact holes 181,182, and 185, and a plurality of openings 189.

In detail, the photoresist 40 initially has a position-dependent thickness such that portions (not shown) on the contact holes 182 and 185 and the openings 189 have smaller thickness than other portions, and there is substantially no photoresist on the contact holes 181. Portions of the interlayer insulating layer 801 and the gate insulating layer 140, which are not covered with the photoresist 40, are removed to form the contact holes 181 exposing the upper layer 129q of the end portions 129 of the gate lines 121 and the upper conductors 174q. At this time, the portions of the photoresist 40 having the smaller thickness prevent portions of the gate insulating layer 140 disposed in the contact holes 182 and 185 and the openings 189 from being removed so that the portions of the gate insulating layer 140 near the edges of the conductors 174 may not be overcut. Thereafter, portions of the photoresist 40 on the contact holes 182, 185, and the openings 189 are removed to expose underlying portions of the passivation layer 180, and the exposed portions of the passivation layer 180 are removed to form the contact holes 182, 185, and the openings 189 as shown in FIGS. 8A and 8B.

As shown in FIGS. 9A and 9B, after or before removing the photoresist 40, the exposed portions of the upper conductors 174q and the upper layer 129q are removed to expose the lower conductors 174p and the lower layer 129p and to complete the upper layers 171q and 175q of the end portions 179 and the drain electrodes 175 as shown in FIGS. 9A and 9B. The etch condition for etching the upper conductors 174q and the upper layer 129q is determined so that the lower conductors 174p and the lower layer 129p may not be etched. At this time, the undercut of the upper conductors 174q and the upper layer 129q may be formed.

Referring to FIGS. 10 to 11B, a transparent layer is sputtered and photo-etched to form a plurality of pixel electrodes 191, and a plurality of contact assistants 81 and 82.

Here, the pixel electrode 191 is made of a transparent material including a nitride gradient. Preferably, the pixel electrode 191 may be made as a single layer of ITON or IZON, or as a double layer of ITO/ITON or IZO/IZON. In the former, the ITO or IZO is sputted under an $N_2$ atmosphere to form the pixel electrode 191. In the latter, the ITO or IZO is firstly sputted to form the lower layer 191p of the pixel electrode 191, and the nitrification process of injecting nitrogen gas is secondly executed to form the upper layer 191q of ITON or IZON. The thickness of the upper layer 191q may be in the range of 50-500 angstroms, and the pixel electrode 191 may be formed as a double layer of an ITO/oxidation layer or an IZO/oxidation layer.

The contact assistants 81 and 82 and the pixel electrodes 191 cover the exposed portions of the lower conductors 129p exposed through the contact holes 181, the exposed portions of the lower conductors 174p exposed through the contact holes 182, and the exposed portions of the gate insulating layer 140 exposed through the contact holes 182 and 185 and the openings 189. However, the exposed portions of the lower conductors 174p exposed through the openings 189 are not covered yet. The exposed portions of the lower conductors 174p are removed by blanket etching to expose the extrinsic semiconductor stripes 164 and to complete the lower layers 171p and 175p of the data lines 171 and the drain electrodes 175.

Referring to FIGS. 12A and 12B, the exposed portions of the extrinsic semiconductor stripes 164, which are not covered with the data lines 171 and the drain electrodes 175, are removed by blanket etching to complete a plurality of ohmic contact stripes 161 including a plurality of projections 163 and a plurality of ohmic contact islands 165, and to expose projections 154 of the intrinsic semiconductor stripes 151.

An $H_2$ cleaning treatment may follow thereafter in order to stabilize the exposed surfaces of the semiconductor stripes 151.

At this time, because the pixel electrode includes the upper layer 191q of ITON or IZON, the opaque metal is not produced on the surfaces of the pixel electrode 191 when executing $H_2$ cleaning. Accordingly, the transmittance is improved.

Finally, a plurality of passivation layers 180 made of silicon nitride are formed on the exposed projections 154 of the semiconductor stripes 151, and a plurality of interval members 320 are formed on the passivation layer 180 as shown in FIGS. 1 to 2B.

A TFT array panel for an LCD according to another embodiment of the present invention is described below in detail with reference to FIGS. 13 and 14. In this embodiment, a pixel electrode is located under a passivation layer.

Figure 13:
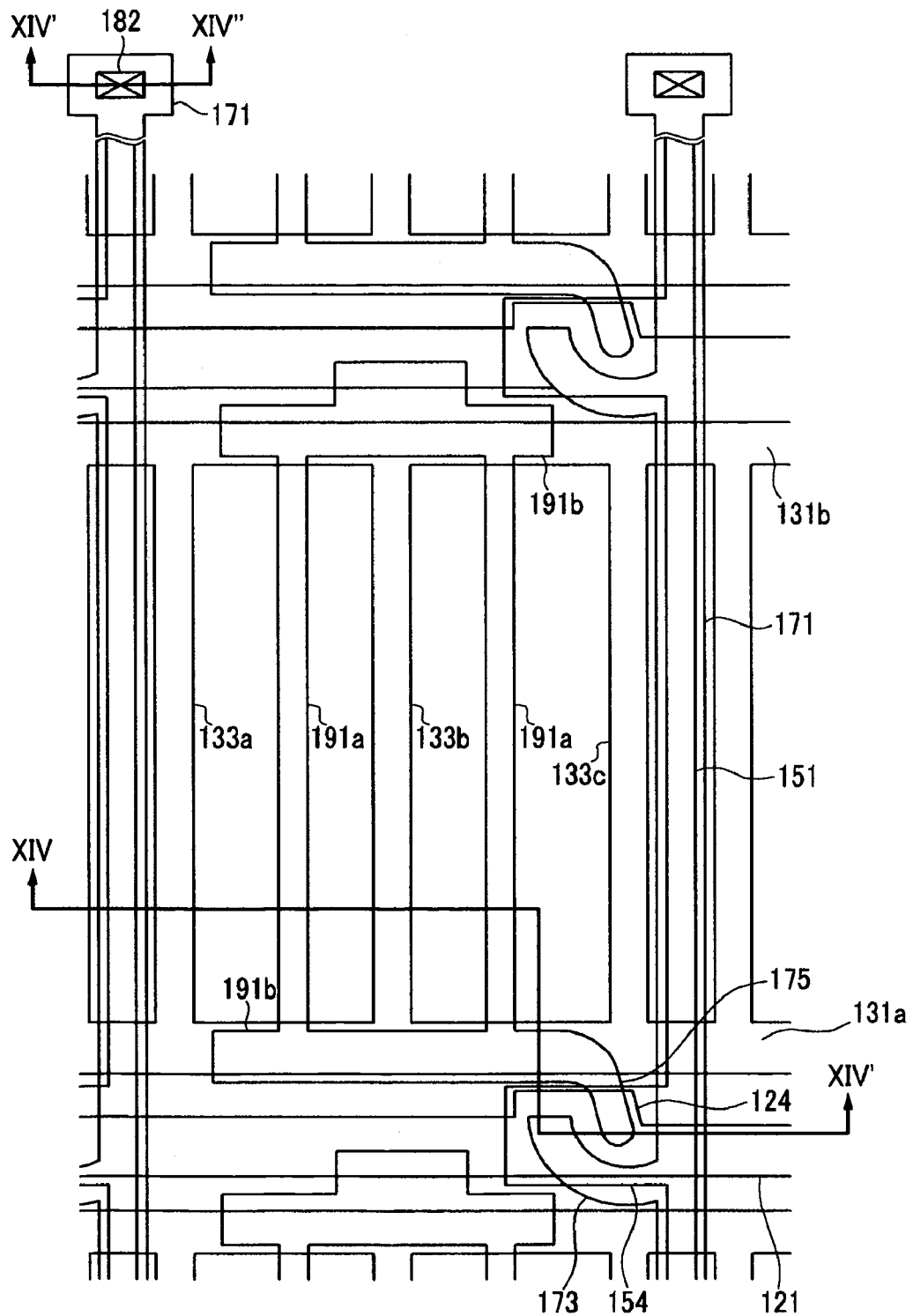
FIG. 13 is a layout view of a TFT array panel for an LCD according to another embodiment of the present invention.
Figure 14:
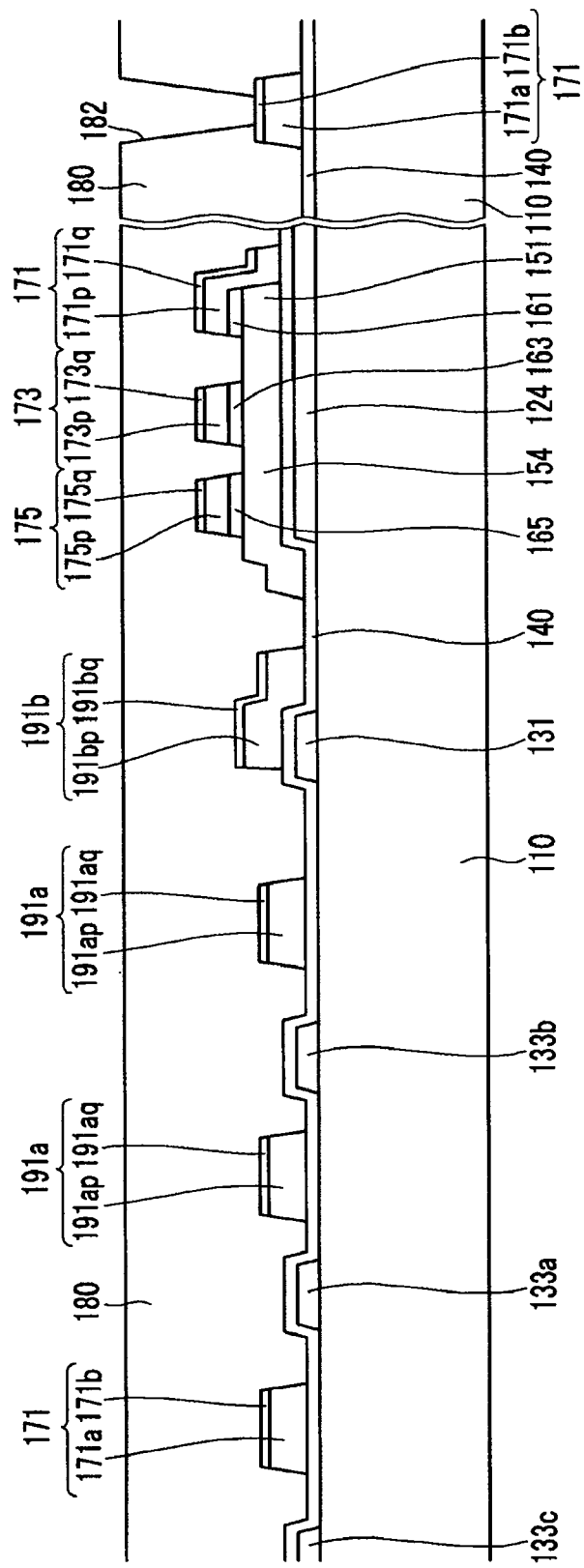
FIG. 14 is a sectional view of the TFT array panel shown in FIG. 13 taken along the line XIV-XIV.

FIG. 13 is a layout view of a TFT array panel for an LCD according to another embodiment of the present invention and FIG. 14 is a sectional view of the TFT array panel shown in FIG. 13 taken along the line XIV-XIV'-XIV".

A plurality of gate lines 121 and a plurality of common electrode lines 131a and 131b are formed on an insulating substrate 110 made of a material such as transparent glass.

The gate lines 121 extend substantially in a transverse direction and are separated from each other, and transmit gate signals. Each gate line 121 includes a plurality of projections forming a plurality of gate electrodes 124, and an end portion (not shown) having a large area for contact with another layer or an external driving circuit. The gate lines 121 may extend to be connected with a driving circuit that may be integrated on the TFT array panel 100.

Each of common electrode lines 131a and 131b extend substantially in the transverse direction and are disposed between two adjacent gate lines 121 and close to the two gate lines 121. Each of the common electrode lines 131a and 131b includes a plurality of sets of common electrodes 133a-133c connecting the two common electrode lines 131a and 131b to each other and extending substantially in a vertical direction.

The common electrode lines 131a and 131b are supplied with a reference voltage such as a common voltage.

The gate lines 121 and the common electrode lines 131a and 131b are preferably made of an Al-containing metal such as Al and an Al alloy, an Ag-containing metal such as Ag and an Ag alloy, a Cu-containing metal such as Cu and a Cu alloy, an Mo-containing metal such as Mo and an Mo alloy, Cr, Ti, or Ta. The gate lines 121 and the common electrode lines 131a and 131b may have a multi-layered structure including two layers having different physical characteristics. One of the two layers is preferably made of a low resistivity metal such as an Al-containing metal, an Ag-containing metal, or a Cu-containing metal for reducing signal delay or voltage drop in the gate lines 121 and the common electrode lines 131a and 131b. The other layer is preferably made of a material such as an Mo containing metal, Cr, Ta, or Ti, which has good physical, chemical, and electrical contact characteristics with other materials such as indium tin oxide (ITO) or indium zinc oxide (IZO). Good examples of the combination of the two layers are a lower Cr layer and an upper Al—Nd alloy layer combination, or a lower Al layer and an upper Mo layer combination. The gate lines 121 and the common electrode lines 131a and 131b may have a triple-layered structure, and it is preferable that a conductive layer including Al is disposed in the middle position.

In addition, the lateral sides of the gate lines 121 and the common electrode lines 131a and 131b are inclined relative to a surface of the substrate to smooth the profile of the surface of upper layers, thereby improving the adhesion of the upper layers.

A gate insulating layer 140 preferably made of silicon nitride (SiNx) or silicon oxide (SiOx) is formed on the gate lines 121 and the common electrode lines 131a and 131b.

A plurality of semiconductor stripes 151 preferably made of hydrogenated amorphous silicon (abbreviated to "a-Si") or polysilicon are formed on the gate insulating layer 140. Each semiconductor stripe 151 extends substantially in the longitudinal direction and has a plurality of projections 154 branched out toward the gate electrodes 124.

A plurality of ohmic contact stripes and islands 161 and 165 preferably made of silicide or n+hydrogenated a-Si heavily doped with an N-type impurity such as phosphorous are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate.

A plurality of data lines 171, a plurality of drain electrodes 175 separated from the data lines 171, and a plurality of longitudinal portions 191a and horizontal portions 191b of the pixel electrodes 191 are formed on the ohmic contacts 161 and 165 and the gate insulating layer 140.

The data lines 171 for transmitting data voltages extend substantially in the longitudinal direction and cross the gate lines 121 and the common electrode lines 131a and 131b. Each data line 171 includes an end portion 179 having a large area for contact with another layer or an external device. Each data line 171 includes a plurality of source electrodes projecting toward the drain electrodes 175 and having a "U" shape.

The pixel electrode portions 191a and 191b are located at regions enclosed by the gate lines 121 and the data lines 171, and each region includes a plurality of horizontal portions 191b disposed in pairs and close to the two adjacent gate lines 121, and a plurality of longitudinal portions 191a connecting the horizontal portions 191b and disposed between the common electrodes 133a-133c. The horizontal portions 191b may overlap the gate lines 121.

Each drain electrode 175 includes an end portion connecting the horizontal portions 191b of the pixel electrode 191 and another end portion disposed on a gate electrode 124 and partly enclosed by a source electrode 173. A gate electrode 124, a source electrode 173, and a drain electrode 175 along with a projection 154 of a semiconductor stripe 151 form a TFT having a channel formed in the projection 154 disposed between the source electrode 173 and the drain electrode 175. Here, the horizontal portions 191b and the drain electrode 175 overlap the common electrode lines 131a and 131b to form a storage capacitor.

The pixel electrode portions 191a and 191b are made of a transparent material including a nitride gradient. Preferably, the pixel electrode portions 191a and 191b are made of a single layer of ITON or IZON, or a double layer including a lower layer 191ap, 191bp of ITO or IZO, and an upper layer 191aq, 191bq of ITON or IZON.

A passivation layer 180 is formed on the data lines 171, the drain electrodes 175, the pixel electrode portions 191a and 191b, and the exposed portions of the semiconductor stripes 151. The passivation layer 180 is preferably made of an inorganic insulator such as silicon nitride or silicon oxide, a photosensitive organic material having a good flatness characteristic, or a low dielectric insulating material having a dielectric constant lower than 4.0 such as a-Si:C:O and a-Si:O:F formed by plasma enhanced chemical vapor deposition (PECVD). The passivation layer 180 may have a double-layered structure including a lower inorganic layer and an upper organic layer.

The passivation layer 180 has a plurality of contact holes 182 exposing the end portions 179 of the data lines 171. The passivation layer 180 and the gate insulating layer 140 may have a plurality of contact holes (not shown) exposing the end portions 129 of the gate lines 121.

A method of manufacturing the TFT array panel shown in FIGS. 13 and 14 according to another embodiment of the present invention will now be described in detail with reference to FIGS. 15A to 17B as well as FIGS. 13 and 14.

Figure 15A:
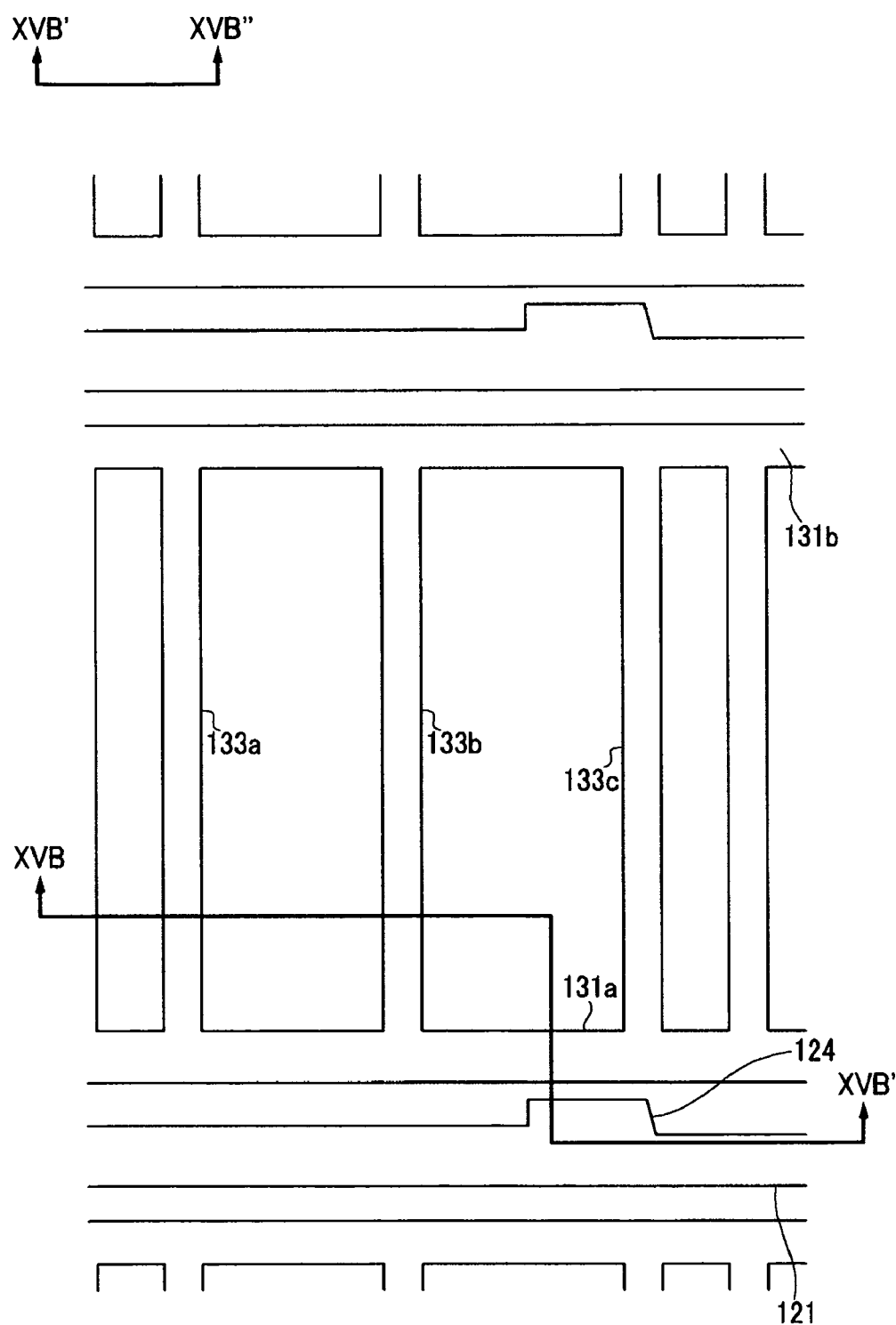
FIG. 15A is a layout view of a TFT array panel shown in FIGS. 13 and 14 in the first step of a manufacturing method thereof according to an embodiment of the present invention.
Figure 15B:
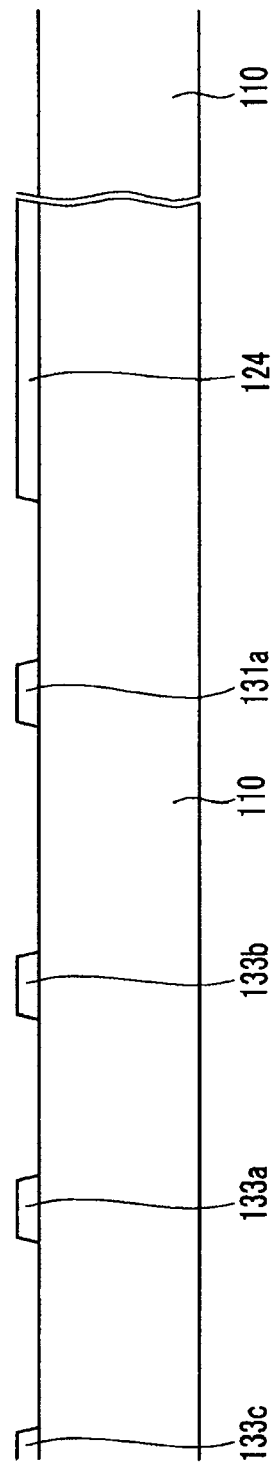
FIG. 15B is a sectional view of the TFT array panel shown in FIG. 15A taken along the lines XVB-XVB'-XVB"
Figure 16A:
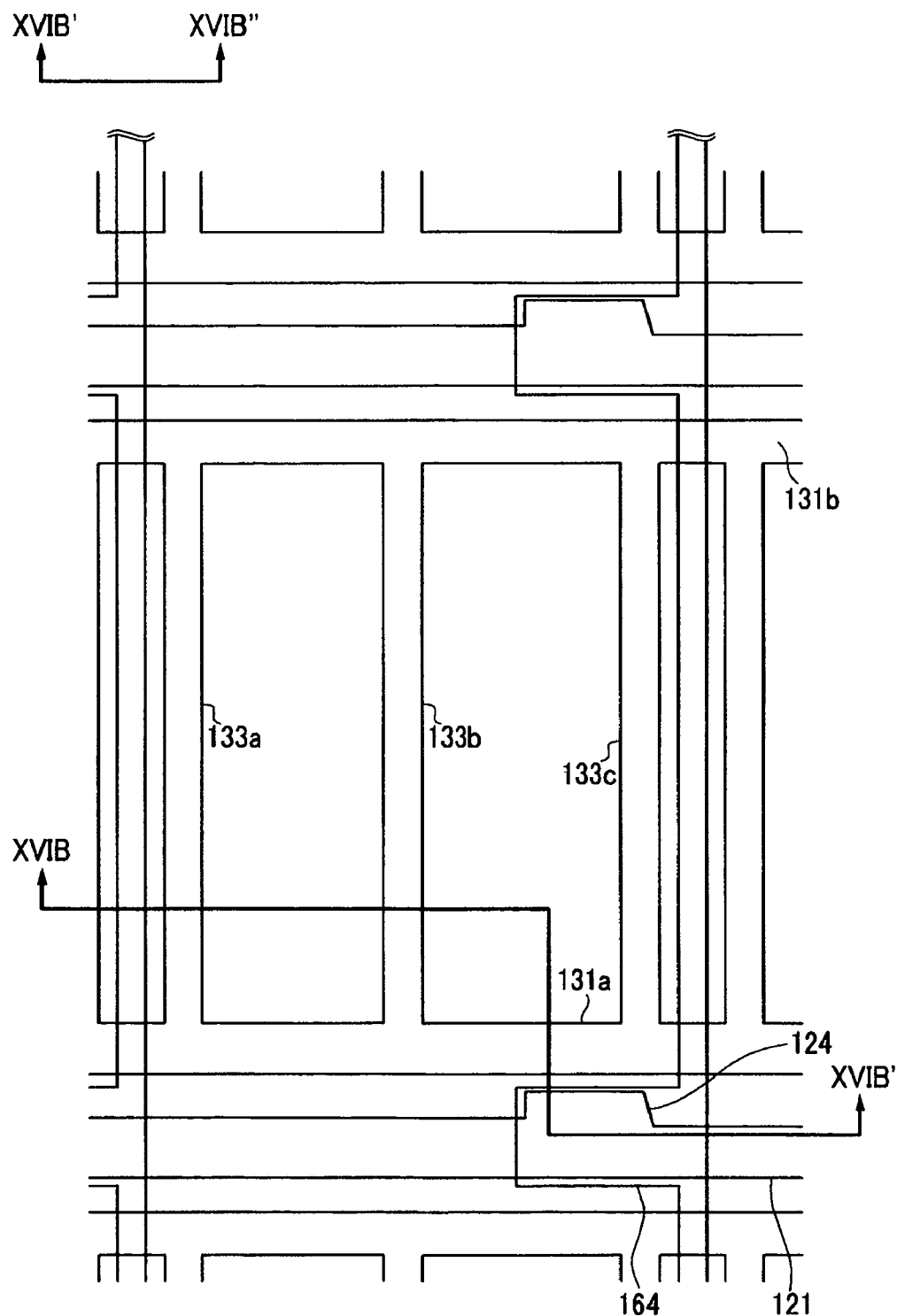
FIG. 16A is a layout view of the TFT array panel in the step following the step shown in FIG. 15A.
Figure 17A:
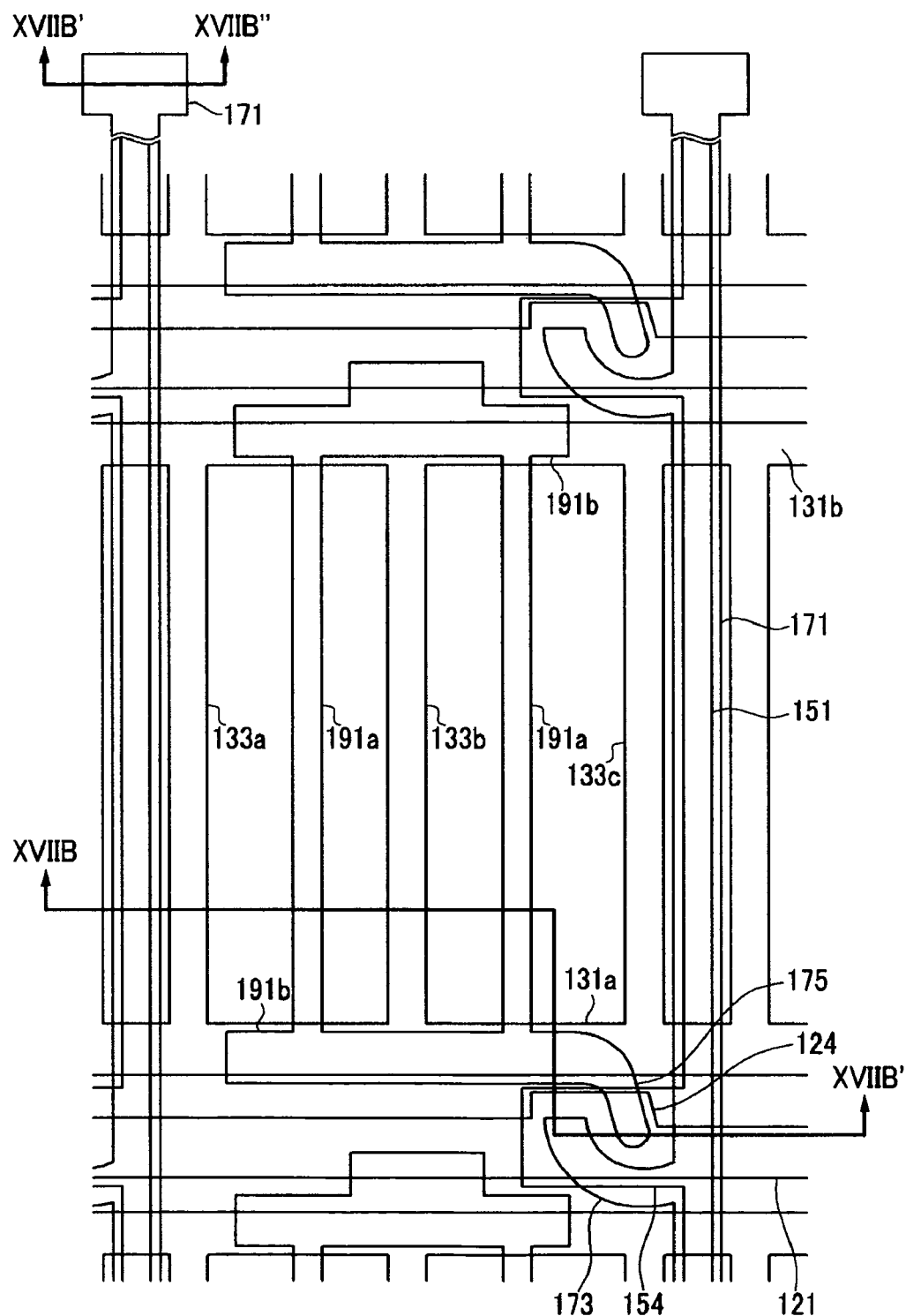
FIG. 17A is a layout view of the TFT array panel in the step following the step shown in FIG. 16A.
Figure 17B:
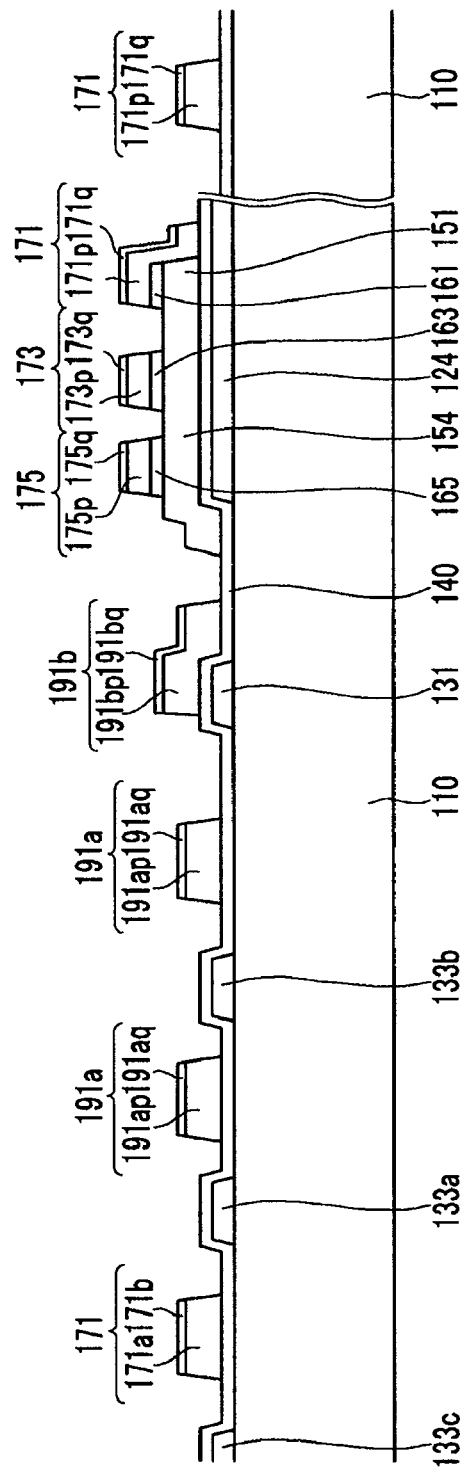
FIG. 17B is a sectional view of the TFT array panel shown in FIG. 17A taken along the lines XVIIB-XVIIB'-XVIIB"

FIG. 15A is a layout view of a TFT array panel shown in FIGS. 13 and 14 in the first step of a manufacturing method thereof according to an embodiment of the present invention, FIG. 15B is a sectional view of the TFT array panel shown in FIG. 15A taken along the lines XVB-XVB'-XVB", FIG. 16A is a layout view of the TFT array panel in the step following the step shown in FIG. 15A, FIG. 16B is a sectional view of the TFT array panel shown in FIG. 16A taken along the lines XVIB-XVIB'-XVIB", FIG. 17A is a layout view of the TFT array panel in the step following the step shown in FIG. 16A, and FIG. 17B is a sectional view of the TFT array panel shown in FIG. 17A taken along the lines XVIIB-XVIIB'-XVIIB";

Referring to FIGS. 15A and 15B, a gate conductive layer having a single layered structure or multi layered structure is sputtered on an insulating substrate 110 and patterned by dry or wet etching to form a plurality of gate lines 121 including a plurality of gate electrodes 124 and a plurality of common electrode lines 131a and 131b.

Referring to FIGS. 16A and 16B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140.

Referring to FIGS. 17A and 17B, a conductive layer is sputtered and etched using a photoresist film (not shown) to form a plurality of data lines 171 including a plurality of source electrodes 173, a plurality of drain electrodes 175, and a plurality of pixel electrode portions 191a and 191b.

Here, the pixel electrode portions 191a and 191b, the drain electrodes 175 and the data lines 171 are made of a transparent material including a nitride gradient. Preferably, the pixel electrode portions 191a and 191b, the drain electrodes 175 and the data lines 171 are made of single layer of ITON or IZON, or a double layer of ITO/ITON or IZO/IZON.

In the former, the ITO or IZO is supported under an $N_2$ atmosphere to form the pixel electrode portions 191a and 191b, the drain electrodes 175, and the data lines 171. In the latter, the ITO or IZO is firstly supported to form the first layer 191ap, 191bp, 171p, and 175p, and the nitrification process of injecting nitrogen gas is secondly executed to form second layer 191aq, 191bq, 175q, and 171q of ITON or IZON. The thickness of the ITON or IZON may be in the range of 50-500 angstroms, and the pixel electrode portions 191a and 191b, the drain electrodes 175, and the data lines 171 may be formed of a double layer of ITO/oxidation layer or IZO/oxidation layer by executing an oxidation process instead of the nitrification process.

Next, the exposed portions of the extrinsic semiconductor stripes 164, which are not covered with the data lines 171 and the drain electrodes 175, are removed by blanket etching to complete a plurality of ohmic contact stripes 161 including a plurality of projections 163, and a plurality of ohmic contact islands 165, and to expose projections 154 of the intrinsic semiconductor stripes 151.

The pixel electrode portions 191a and 191b and the data lines 171 are formed as different layers. At this time, the data lines may be made of a conductive material having a lower resistance than that of ITON, IZON, ITO, and IZO.

Referring to FIGS. 13 and 14, the exposed projections 154 of the intrinsic semiconductor stripes 151, which are not covered by the pixel electrodes 191a and 191b, and the data lines 171, are cleaned using an $H_2$ treatment. Then, a passivation layer 180 is formed on the gate insulating layer 140. The passivation layer 180 is preferably made of an inorganic insulator such as silicon nitride or silicon oxide, a photosensitive organic material having a good flatness characteristic, or a low dielectric insulating material such as a-Si:C:O and a-Si:O:F formed by plasma enhanced chemical vapor deposition (PECVD).

Next, the passivation layer 180 is etched using a photolithography process to form a plurality of contact holes 182 exposing the end portions 179 of the data lines 171. When the passivation layer 191 is made of a photosensitive organic material, only the photolithography process is used to form the contact holes 182 without using a photoresist.

A TFT array panel for an LCD according to another embodiment of the present invention will be described in detail with reference to FIGS. 18 to 19B. In this embodiment, a common electrode made of ITO or IZO is located under a gate insulating layer.

A plurality of gate lines 121 and a plurality of common electrode lines 270 are formed on an insulating substrate 110 made of a material such as transparent glass.

The gate lines 121 extend substantially in a transverse direction and are separated from each other and transmit gate signals. Each gate line 121 includes a plurality of projections forming a plurality of gate electrodes 124, and an end portion 129 having a large area for contact with another layer or an external driving circuit. The gate lines 121 may extend to be connected to a driving circuit that may be integrated on the TFT array panel 100.

Each common electrode 270 extends substantially in the transverse direction and are supplied with a common voltage. The common electrode are disposed between two adjacent of the gate lines 121 and includes a plurality of connections 272 having narrower widths than other portions.

The gate lines 121 and are preferably made of an Al-containing metal such as Al and an Al alloy, an Ag-containing metal such as Ag and an Ag alloy, a Cu-containing metal such as Cu and a Cu alloy, an Mo-containing metal such as Mo and an Mo alloy, Cr, Ti, or Ta. The gate lines 121 may have a multi-layered structure including two layers having different physical characteristics. One of the two layers is preferably made of a low resistivity metal such as an Al-containing metal, an Ag-containing metal, or a Cu-containing metal for reducing signal delay or voltage drop in the gate lines 121. The other layer is preferably made of a material such as an Mo-containing metal, Cr, Ta, or Ti, which has good physical, chemical, and electrical contact characteristics with other materials such as indium tin oxide (ITO) or indium zinc oxide (IZO). Good examples of the combination of the two layers are a lower Cr layer and an upper Al—Nd alloy layer and a lower Al layer and an upper Mo layer. However, the gate lines 121 may be made of other various metals or conductive materials.

The common electrodes 270 are made of a single layer made of indium zinc oxide nitride (IZON), indium tin oxide nitride (ITON), or amorphous indium tin oxide nitride (a-ITON), or it includes two layers having a lower layer 270p made of IZO, ITO, or a-ITO (amorphous indium tin oxide), and an upper layer 270q made of IZON, ITON, or a-ITON.

The lateral sides of the gate lines 121 and the common electrodes 270 are inclined relative to a surface of the substrate, and the inclination angle thereof ranges about 20-80 degrees.

A gate insulating layer 140 preferably made of silicon nitride (SiNx) is formed on the gate lines 121 and the common electrodes 270.

A plurality of semiconductor stripes 151 preferably made of hydrogenated amorphous silicon (abbreviated to "a-Si") or polysilicon are formed on the gate insulating layer 140. Each semiconductor stripe 151 extends substantially in the longitudinal direction and has a plurality of projections 154 branched out toward the gate electrodes 124.

A plurality of ohmic contact stripes and islands 161 and 165 preferably made of silicide or n+hydrogenated a-Si heavily doped with an N-type impurity such as phosphorous are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate, and the inclination angles thereof are preferably in a range between about 30-80 degrees.

A plurality of data lines 171 and a plurality of drain electrodes 175 separated from the data lines 171 are formed on the ohmic contacts 161 and 165 and the gate insulating layer 140.

The data lines 171 for transmitting data voltages extend substantially in the longitudinal direction and cross the gate lines 121 at right angles. The data lines 171 also intersect the connections 272 of the common electrodes 270 such that each data line 171 are disposed between the common electrodes 270. Each data line 171 includes an end portion 179 having a large area for contact with another layer or an external device. Each data line 171 includes a plurality of source electrodes 173 projecting toward the drain electrodes 175.

Each drain electrode 175 includes an end portion for contact with another layer and another end portion disposed on a gate electrode 124 and close to a source electrode 173.

A gate electrode 124, a source electrode 173, and a drain electrode 175 along with a projection 154 of a semiconductor stripe 151 form a TFT having a channel formed in the projection 154 disposed between the source electrode 173 and the drain electrode 175.

The data lines 171 and the drain electrodes 175 are preferably made of a refractory metal such as Cr, Mo, Ti, Ta, or alloys thereof. However, they may also have a multilayered structure including a low-resistivity layer (not shown) and a good-contact layer (not shown). A good example of the combination is a lower Mo layer, an intermediate Al layer, and an upper Mo layer as well as the above-described combinations of a lower Cr layer and an upper Al—Nd alloy layer and a lower Al layer and. an upper Mo layer. However, the data lines 171 and the drain electrodes 175 may be made of other various metals or conductive materials.

Like the gate lines 121 and the common electrodes 270, the data lines 171 and the drain electrodes 175 have tapered lateral sides, and the inclination angles thereof range about 30-80 degrees.

The ohmic contacts 161 and 165 are interposed only between the underlying semiconductor stripes 151 and the overlying data lines 171 and the overlying drain electrodes 175 thereon, and reduce the contact resistance therebetween. The semiconductor stripes 151 according to this embodiment have almost the same planar shapes as the data lines 171 and the drain electrodes 175 as well as the underlying ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175.

A passivation layer 180 is formed on the data lines 171, the drain electrodes 175, and the exposed portions of the semiconductor stripes 151. The passivation layer 180 is preferably made of an inorganic insulator such as silicon nitride or silicon oxide, a photosensitive organic material having a good flatness characteristic, or a low dielectric insulating material having a dielectric constant lower than 4.0 such as a-Si:C:O and a-Si:O:F formed by plasma enhanced chemical vapor deposition (PECVD). The passivation layer 180 may have a double-layered structure including a lower inorganic layer and an upper organic layer.

The passivation layer 180 has a plurality of contact holes 182 and 185 exposing the end portions 179 of the data lines 171 and the end portions of the drain electrodes 175, respectively. The passivation layer 180 and the gate insulating layer 140 have a plurality of contact holes 181 exposing the end portions 129 of the gate lines 121.

A plurality of pixel electrodes 191, a plurality of contact assistants 81 and 82, and a plurality of overpasses 83, which are preferably made of a transparent conductor such as ITO or IZO or a reflective conductor such as Ag or Al, are formed on the passivation layer 180.

The pixel electrodes 191 extend substantially in the longitudinal direction and overlap the common electrodes 270. The pixel electrodes 191 include a plurality of branches parallel to the data lines 171 with a line shape. Because a parasitic capacitance is generated at the portion overlapping the data lines 171, the data signals are delayed. Accordingly, large portion of each of the common electrodes 270 are removed and the width of the connections 272 is preferably optimized.

The pixel electrodes 191 are physically and electrically connected to the drain electrodes 175 through the contact holes 185 such that the pixel electrodes 191 receive the data voltages from the drain electrodes 175.

The pixel electrodes 191 supplied with the data voltages generate electrical fields in cooperation with the common electrodes 270, which determine the orientations of liquid crystal molecules in the liquid crystal layer to adjust polarization of incident light.

A pixel electrode 191 and a common electrode 270 form a liquid crystal capacitor and storage capacitor, which stores applied voltages after turn-off of the TFT.

The contact assistants 81 and 82 are connected to the end portions 129 of the gate lines 121 and the end portions 179 of the data lines 171 through the contact holes 181 and 182, respectively. The contact assistants 81 and 82 protect the end portions 129 and 179 and complement the adhesion of the end portions 129 and 179 and external devices.

Now, a driving principle of the liquid crystal display according to another embodiment of the present invention is described in detail with reference to drawings.

FIG. 20 is a layout view of electrodes of an LCD according to the first embodiment of the present invention, and FIG. 21 is a cross-sectional view taken along the line XXI-XXI in FIG. 20, which illustrates both upper and lower panels as well as electrical lines of force between the panels.

First, the structures of a lower panel on which electrodes are formed and an upper panel of the LCD are described in detail.

A common electrode 270 made of a transparent planar conductive material is formed on the inner surface of a lower substrate 110 made of a transparent insulating material such as glass or quartz. The common electrode 270 is covered with a gate insulating layer 140 and a passivation layer 180, and a plurality of narrow linear (pixel) electrodes 191 which are parallel to each other and elongated in the longitudinal direction are formed on the passivation layer 180. The pixel electrodes 191 may be transparent or opaque. The width of the pixel electrodes 191 is equal to or smaller than the distance between the pixel electrodes 191, i.e., the distance between adjacent boundary lines of the two adjacent pixel electrodes 191. An aligning layer 11 made of polyimide is coated over the entire surface, it may be rubbed or not, and it may be homogeneous. A polarizing plate or an aligning film 21 is attached on the outer surface of the lower substrate 110.

A color filter 230 is formed on the inner surface of an upper substrate 210, which is opposite the lower substrate 110 and is also made of a transparent insulating material, and an aligning film 21 made of polyimide is coated thereon. The aligning film 21 may be homogeneous. A polarizing plate or an analyzer 22 is attached on the outer surface of the upper substrate 210.

Finally, a liquid crystal layer 3 having positive optical anisotropy is interposed between the aligning films 11 and 21 on the substrates 110 and 210. Accordingly, liquid crystal molecules of the liquid crystal layer 3 are aligned nearly parallel to the direction of the pixel electrodes 191 according to the rubbing direction of the aligning film under no electrical field. When applying an electrical field, the liquid crystal molecules of the liquid crystal layer 3 are aligned perpendicular to the direction of the pixel electrodes 191 according to the electrical field to adjust polarization of incident light.

The light source for the liquid crystal display may be either a backlight unit (not shown) located under the lower substrate 110 or external natural light which may enter the LCD through the upper substrate 210. In the case of a reflective type of LCD using natural light, a polarizing plate 12 attached on the lower substrate 110 may not be required, and it is preferable that the pixel electrodes 191 and the common electrodes 270 are made of an opaque material having high reflectance such as aluminum. In addition, the lower substrate 110 may be opaque.

A schematic shape of electrical fields of the above-described LCD is described with reference to FIG. 21.

When voltages are applied to the electrodes 191 and 270, the electrical field shown in FIG. 21 due to the potential difference between the electrodes 191 and 270 is generated. In FIG. 21, dotted lines indicate the electrical lines of force.

As shown in FIG. 21, the shape of the electrical field is symmetrical with respect to a longitudinal central line C (the line C actually corresponds to a plane) of a narrow region NR on the pixel electrodes 191 and a longitudinal central line B (the line B also actually corresponds to a plane) of a wide region WR between the pixel electrodes 191. The lines of electrical field has a semi-elliptical or parabolic shape (hereinafter, the shape of the electrical lines of force is referred as parabolic for simplicity) and is generated in a region between the central line C of the narrow region NR and the central line B of the wide region WR. The vertices of the electrical lines of force are in a boundary line A (the line A actually corresponds to a surface) between the narrow region NR and the wide region WR.

Lines tangent to the electrical lines of force on the boundary line A between the narrow region NR and the wide region WR are substantially parallel to the substrate 110, and those at central points of the narrow region NR and the wide region WR are substantially perpendicular to the substrates 110 and 210. In addition, the center of the parabolic and the vertical vertex of the parabolas are positioned on the boundary line A between the narrow region NR and the wide region WR, and two horizontal vertices are positioned in the wide region WR and the narrow region NR respectively. The parabolas are asymmetrical with respect to the boundary line A since the horizontal vertex positioned in the narrow region NR is closer to the center of the parabola than the horizontal vertex positioned in the wide region WR. In addition, the density of the electrical lines of force varies dependent on position, and thus the field strength also varies in proportion to the density of the electrical lines of force. Accordingly, the field strength is the largest on the boundary line A-A of FIG. 22 between the narrow region NR and the wide region WR, and it decreases toward the central lines C-C and B-B of the broad and the narrow regions BR and NR and to the upper substrate 210.

The behaviors of the liquid crystal molecules due to the electrical field are described hereinafter.

First, the initial states of the liquid crystal molecules are described.

The two aligning films 11 and 21 are rubbed or exposed to ultraviolet light, and the liquid crystal molecules are aligned in one horizontal direction. The liquid crystal molecules may have some pre-tilt angle with respect to the substrates 110 and 210, but they are aligned substantially parallel to the substrates 110 and 210. When viewed on a plane parallel to the substrates 110 and 210, the liquid crystal molecules are arranged to have a predetermined angle with respect to the directions parallel and perpendicular to the pixel electrodes 191. The polarizing directions of the polarizing plates 12 and 22 are perpendicular to each other, and the polarizing direction of the polarizer 12 almost coincides with the rubbing direction. The liquid crystal material inserted between the two aligning films 11 and 21 is a nematic liquid crystal having positive dielectric anisotropy.

It is assumed that voltages are applied to the pixel electrodes 191 and the common electrode 270 and that the voltage applied to the pixel electrodes 191 is higher than that applied to the common electrode 131. Then, the liquid crystal molecules 310 are re-arranged such that the force due to the electrical field which depends on the direction and the strength of the electrical field and an elastic restoring force due to the aligning treatment are balanced with each other.

The rearrangement of the liquid crystal molecules due to the electrical field is described in detail hereinafter.

For simplicity, it is assumed that a direction perpendicular to the substrates is a z direction, a direction perpendicular to the substrates and to the direction of the pixel electrodes 191 is an x direction, and a direction parallel to the direction of the pixel electrodes 191 is a y direction. That is to say, it is assumed that the direction from left to right in FIG. 20 is the positive x direction, the direction upward along the pixel electrodes 191 in FIG. 20 is the positive y direction, and the direction from the lower substrate 210 to the upper substrate 100 in FIG. 21 is the positive z direction.

First, the variation of twist angle, which is defined by the angle made by the projection of the long axis of a liquid crystal molecule 310 with the x-axis or the initially aligned direction on the x-y plane parallel to the substrate 110, is described with reference to FIGS. 22 to 24.

Figure 22:
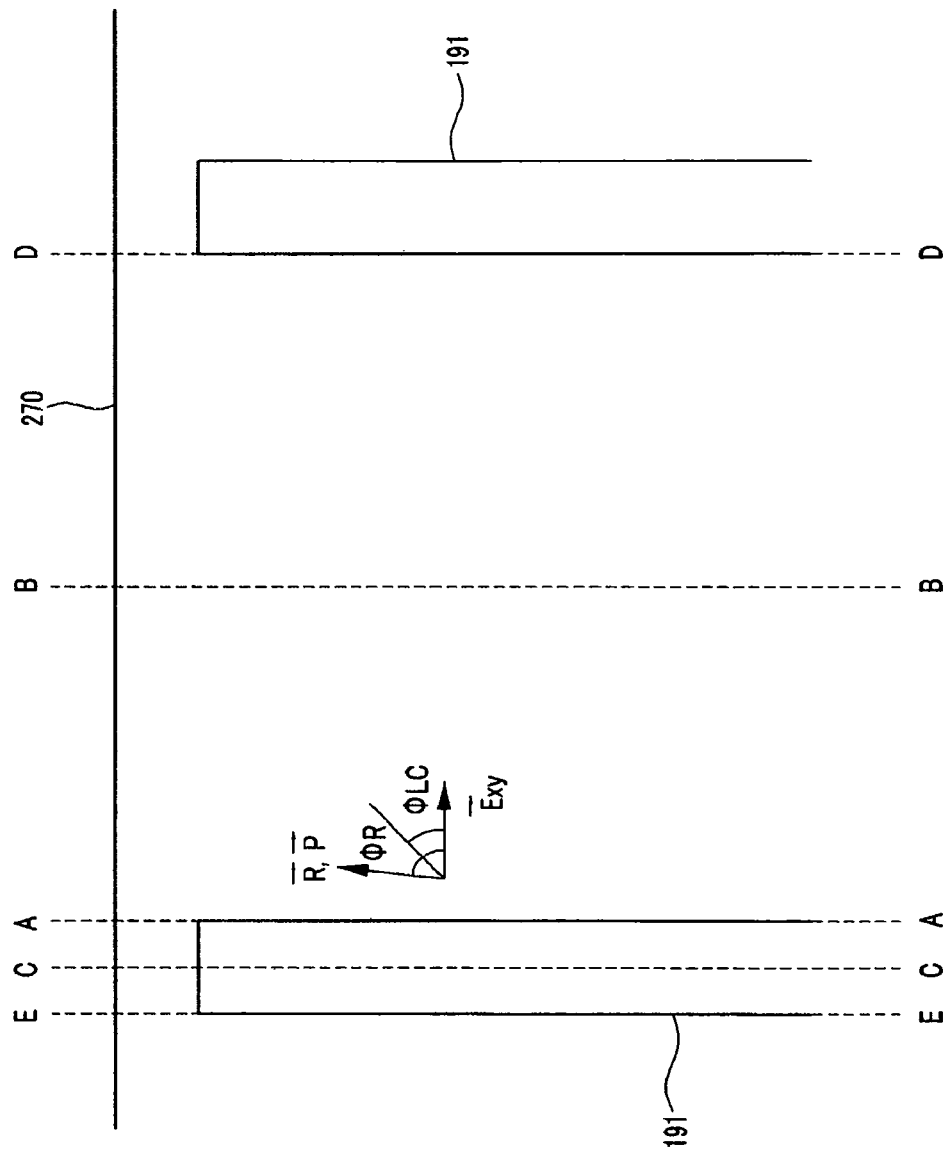
FIG. 22 is a layout view of electrodes illustrating the twist angle of liquid crystal molecules in another embodiment of the present invention.
Figure 23:
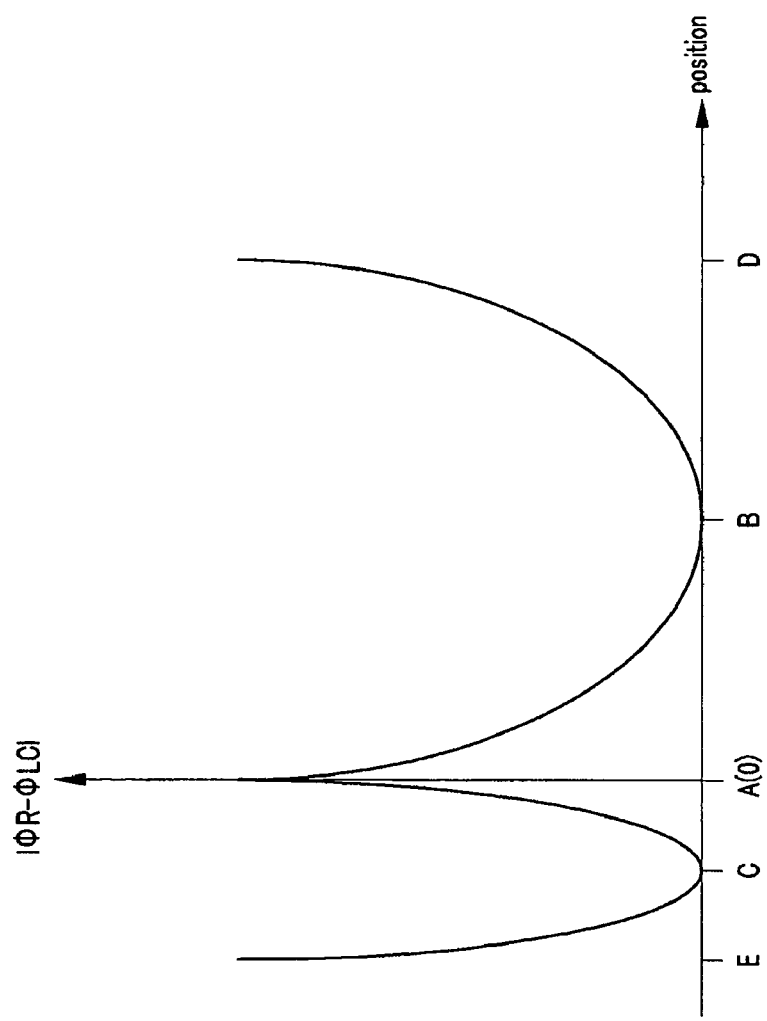
FIG. 23 is a graph illustrating the variation of the twist angle of the liquid crystal molecules as a function of the horizontal position according to another embodiment of the present invention.
Figure 24:
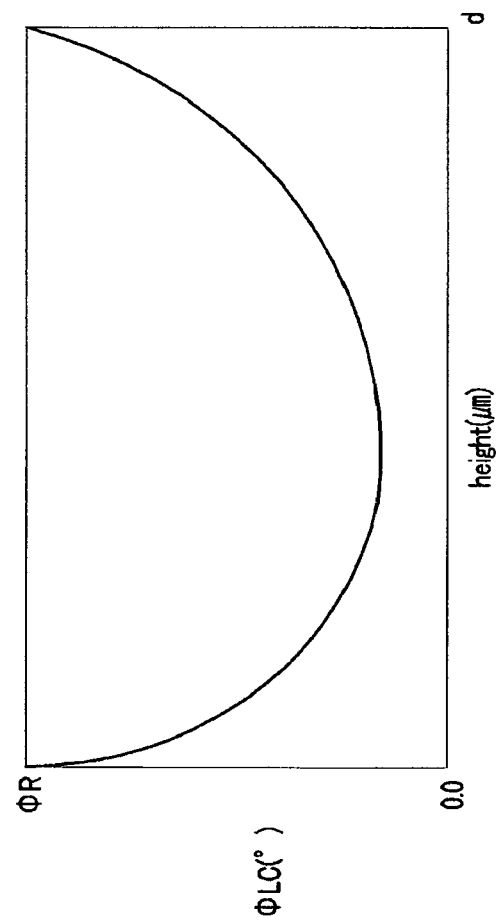
FIG. 24 is a graph illustrating the variation of the twist angle of the liquid crystal molecules as a function of height according to another embodiment of the present invention.

FIG. 22 is a layout view of electrodes illustrating the twist angle of liquid crystal molecules in the embodiment of the present invention, FIG. 23 is a graph illustrating the variation of the twist angle of the liquid crystal molecules as a function of the horizontal position according to the embodiment of the present invention, and FIG. 24 is a graph illustrating the variation of the twist angle of the liquid crystal molecules as a function of height according to the embodiment of the present invention.

As shown in FIG. 22, the rubbing direction is indicated by $\vec{R}$, an x-y plane component of the electrical field is indicated by $\vec{E}_{xy}$, and the polarizing direction or the optical axis of the polarizing plate 12 is indicated by $\vec{P}$, while the angle made by the rubbing direction $\vec{R}$ with the x-axis is represented by $\psi R$, and the angle made by the long axis of the liquid crystal molecule with the x-axis is represented by $\psi LC$. The angle $\psi P$ made by the optical axis of the polarizing plate 12 with the x-axis is equal to $\psi R$ since the optical axis of the polarizing plate 12 is parallel to the rubbing direction $\vec{R}$.

The x-y plane component $\vec{E}_{xy}$ of the electrical field is in the positive x direction from the boundary line A to the central line B of the wide region WR, and in the negative x direction from the central line B of the wide region WR to the next boundary line D.

The strength of the electrical field component $\vec{E}_{xy}$ is the largest on the boundary lines A and D, and it becomes smaller toward the central line B-B, where the strength of the electrical field component $\vec{E}_{xy}$ is zero.

The magnitude of the elastic restoring force generated by the rubbing process is substantially constant on the x-y plane regardless of position.

As illustrated in FIG. 23, the long axis of the liquid crystal molecule or the molecular axis on the boundary lines A and D is substantially parallel to the electrical field component $\vec{E}_{xy}$, and makes a large angle with respect to the rubbing direction $\vec{R}$ since the liquid crystal molecules may be arranged to balance the two forces. However, the closer to the central lines C and B of the regions NR and WR, the smaller the angle $\psi R - \psi LC$ that the molecular axis makes with the rubbing direction $\vec{R}$, and the molecular axis on the central lines B and C is in the rubbing direction $\vec{R}$. The angle made by the optical axis of the polarizing plate 12 with the molecular axis has the same distribution as the above since the optical axis of the polarizing plate 12 is parallel to the rubbing direction $\vec{R}$, and this angle is closely related to the transmittance of the incident light.

Various shapes of electrical fields may be generated by varying the ratio of the widths of the narrow region NR and the wide region WR. Although the narrow region NR on the pixel electrodes 191 cannot be used as the display region when the pixel electrodes 191 are opaque, it may be used as the display region when the pixel electrodes 191 are transparent.

On the other hand, the x-y plane component of the electrical field $\vec{E}_{xy}$ becomes smaller along the z-axis from the lower aligning film 11 to the upper aligning film 21. The elastic restoring force generated by the aligning treatment is the greatest on the surfaces of the aligning films 11 and 21, and it is reduced toward the center of the liquid crystal layer between the aligning films 11 and 21.

FIG. 24 illustrates the twist angle made by the molecular axis with the x-axis from the lower aligning film 11 to the upper aligning film 21 along the z-axis. In FIG. 24, the horizontal axis indicates the height from the lower aligning film 11, and the vertical axis represents the twist angle, where d is the cell gap between the two aligning films 11 and 21.

As illustrated in FIG. 24, the twist angle on the surfaces of the aligning films 11 and 21 is large since the aligning force of the aligning films 11 and 21 is great. The twist angle becomes small toward the center of the liquid crystal layer, and the molecular axis at the center of the liquid crystal layer is substantially in the direction of the electrical field component $\vec{E}_{xy}$. The molecular axis just on the aligning films 11 and 21 is arranged in the rubbing direction $\vec{R}$.

Supposing that the difference of the twist angle between the adjacent liquid crystal molecules is called twist, the twist corresponds to the slope of the curve in FIG. 24. The twist is large near the surfaces of the aligning films 11 and 21, and it decreases toward the center of the liquid crystal layer.

Figure 25:
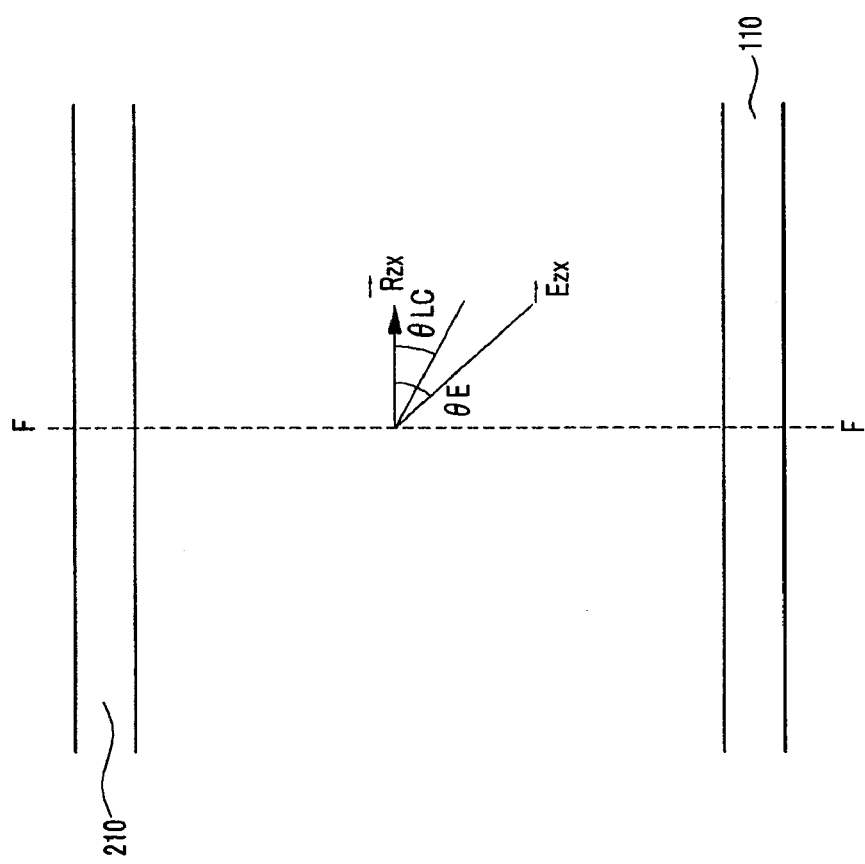
FIG. 25 shows the tilt angle of the liquid crystal molecules according to another embodiment of the present invention.
Figure 26:
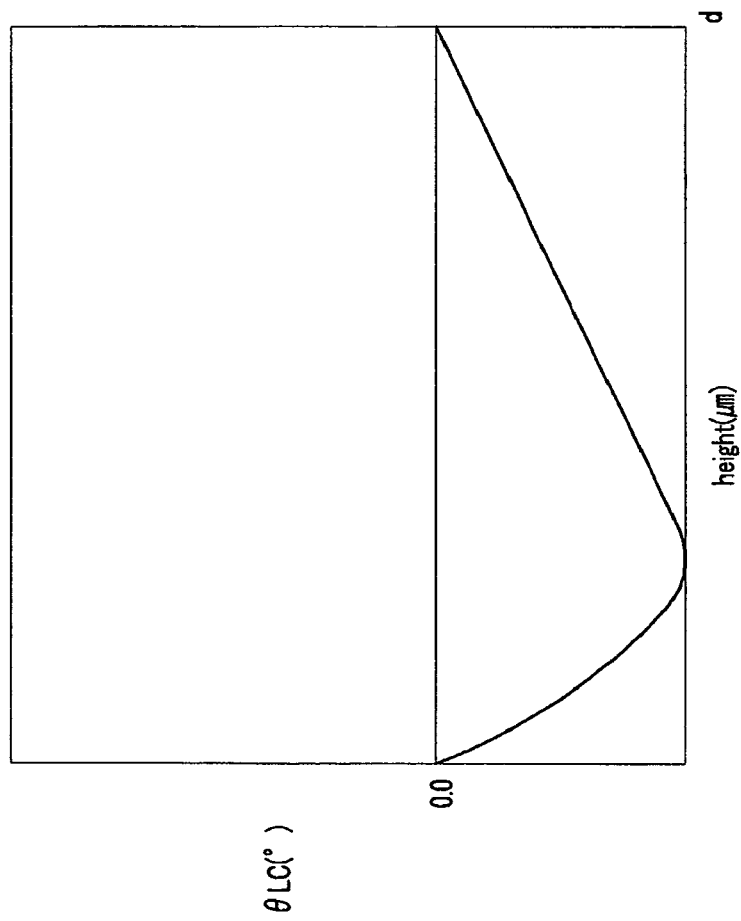
FIG. 26 is a graph illustrating the variation of the tilt angle of the liquid crystal molecules as a function of height according to the first embodiment of the present invention.
Figure 27:
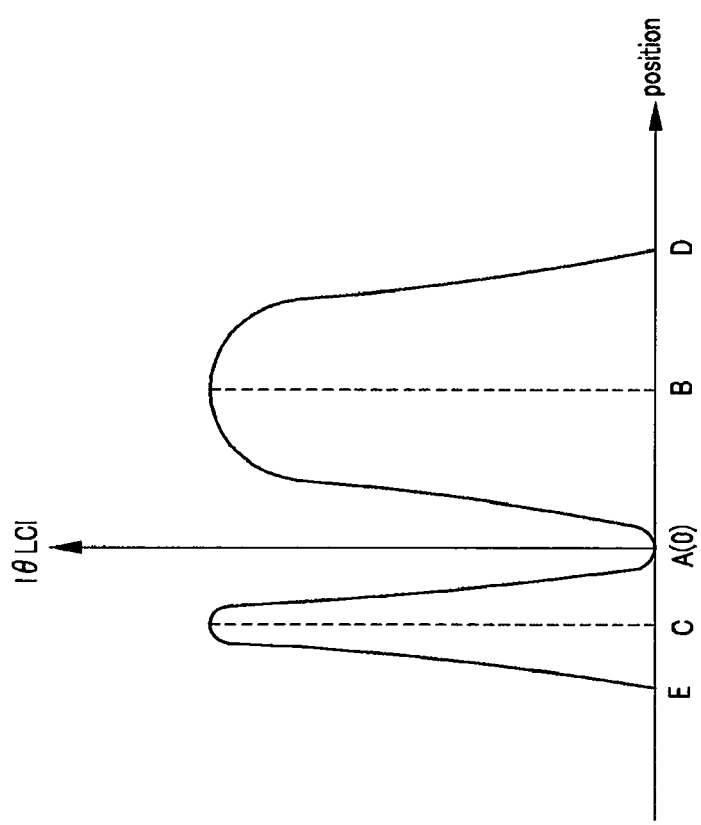
FIG. 27 is a graph illustrating the variation of the tilt angle of the liquid crystal molecules as a function of horizontal position according to the first embodiment of the present invention.

FIGS. 25 to 27 illustrate the variation of the tilt angle that the molecular axis makes with the x-axis or the initially aligned direction on a plane perpendicular to the substrate, for example, a z-x plane.

FIG. 25 shows the tilt angle of the liquid crystal molecules according to the embodiment of the present invention, FIG. 26 is a graph illustrating the variation of the tilt angle of the liquid crystal molecules as a function of height according to the first embodiment of the present invention, and FIG. 27 is a graph illustrating the variation of the tilt angle of the liquid crystal molecules as a function of horizontal position according to the first embodiment of the present invention.

FIG. 25 illustrates only the substrates 110 and 210 for the purpose of simplifying explanation. In FIG. 25, the z-x plane component of the $\vec{R}$ indicating the rubbing direction in FIG. 22 is represented by $\vec{R}_{zx}$, and the z-x plane component of the electrical field is represented by $\vec{E}_{zx}$, while the angle made by the field component $\vec{E}_{zx}$ with the x-axis is indicated by θE, and the tilt angle made by the molecular axis with the x-axis is indicated by θLC. Here, $\vec{R}_{zx}$ is in the x direction since the vector $\vec{R}$ exists on the x-y plane assuming a pretilt angle is ignored.

The magnitude of the field component $\vec{E}_{zx}$ and the angle θE becomes small toward the upper substrate 210 from the lower substrate 110.

As described above, the elastic restoring force by the aligning treatment is the largest on the surfaces of the two substrates 110 and 210, and it becomes small toward the center of the liquid crystal layer.

The liquid crystal molecules may be arranged to balance the two forces. As illustrated in FIG. 26, the molecular axis on the surfaces of the substrates 110 and 210 is arranged substantially parallel to the x-axis since the aligning force is the strongest there. Since the force due to the electrical field becomes relatively stronger compared with the aligning force from the substrates 110 and 210 to a certain point, the magnitude of the tilt angle $\theta_{LC}$ increases continuously. Here, the vertex of the curve is formed at a point near the lower substrate 110.

On the other hand, the angle EE that the field component $\vec{E}_{zx}$ makes with the x-axis is almost zero on the boundary lines A and D, and it becomes large toward the central line B-B. The magnitude of the field component $\vec{E}_{zx}$ is the greatest on the boundary lines A and D, and it is reduced toward the central line B-B.

The magnitude of the elastic restoring force by the aligning treatment is constant on the x-axis regardless of position.

Accordingly, as illustrated in FIG. 27, the tilt angle of the liquid crystal molecule is almost zero on the boundary lines A and D, and it decreases toward the central lines C and B. Therefore, the tilt angle of the liquid crystal molecules has a similar distribution to the angle θE made by the field component $\vec{E}_{zx}$ with the x-axis, although the tilt angle varies more smoothly than the angle θE.

As described above, when the voltages are applied to the two electrodes 191 and 131, the liquid crystal molecules are re-arranged to have the twist angle and the tilt angle. The transmittance of the incident light varies due to the variation of the twist angle and the tilt angle. On the boundary lines A and D, there is little variation in the tilt angle along the z-axis, but the twist angle varies a lot. On the central lines B and C, on the other hand, there is little variation in the twist angle along the z-axis, and there is little variation in the tilt angle. Accordingly, both the twist angle and the tilt angle vary in the region between the boundary lines A and D and the central lines B and C. As a result, a transmittance curve as a function of position has a similar shape to the electrical lines of force.

A method of manufacturing the TFT array panel shown in FIGS. 18 to 19B according to another embodiment of the present invention will be now described in detail with reference to FIGS. 28 to 37B as well as FIGS. 18 to 19B.

Figure 18:
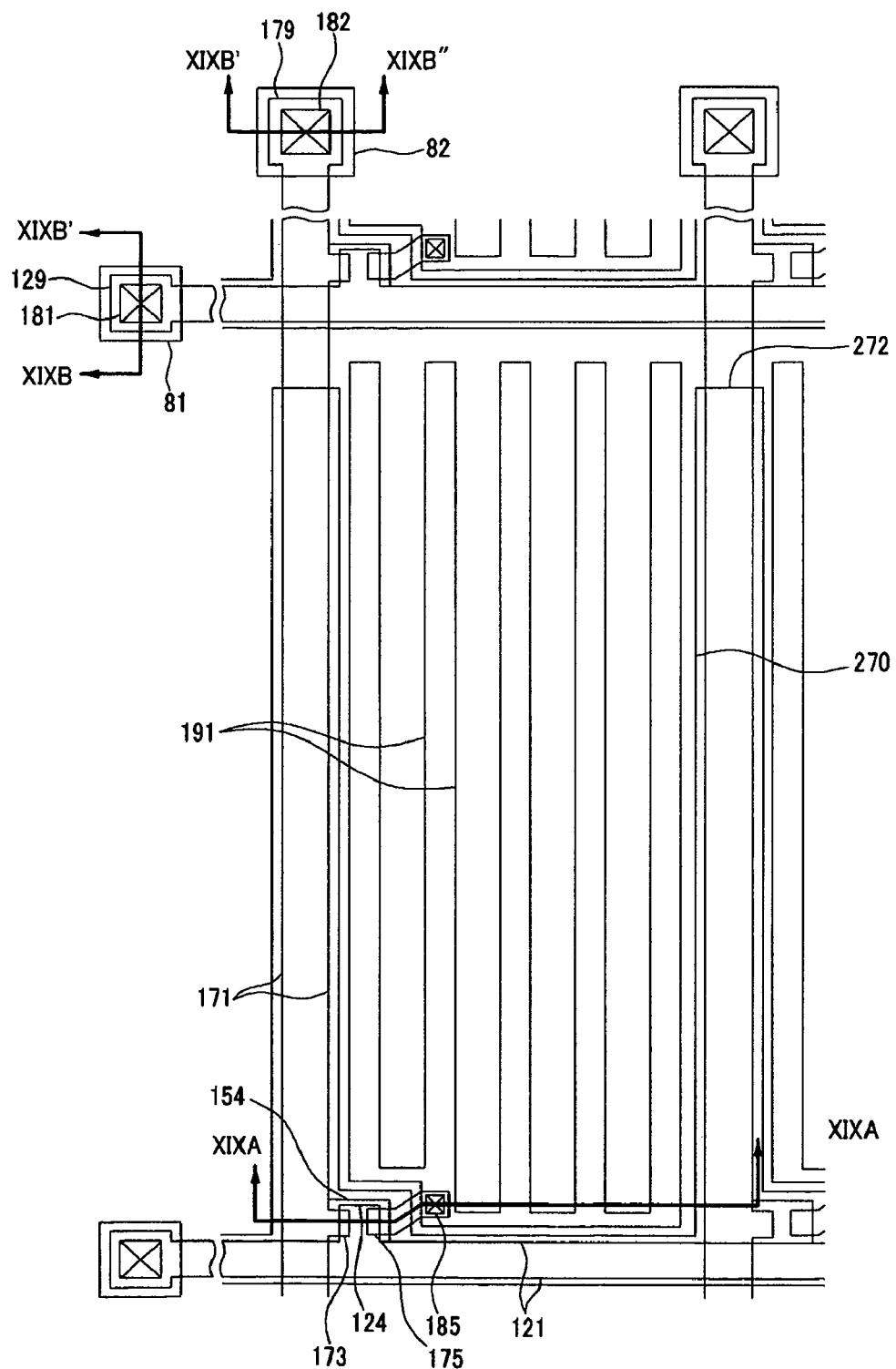
FIG. 18 is a layout view of a TFT array panel for an LCD according to another embodiment of the present invention.
Figure 19A:
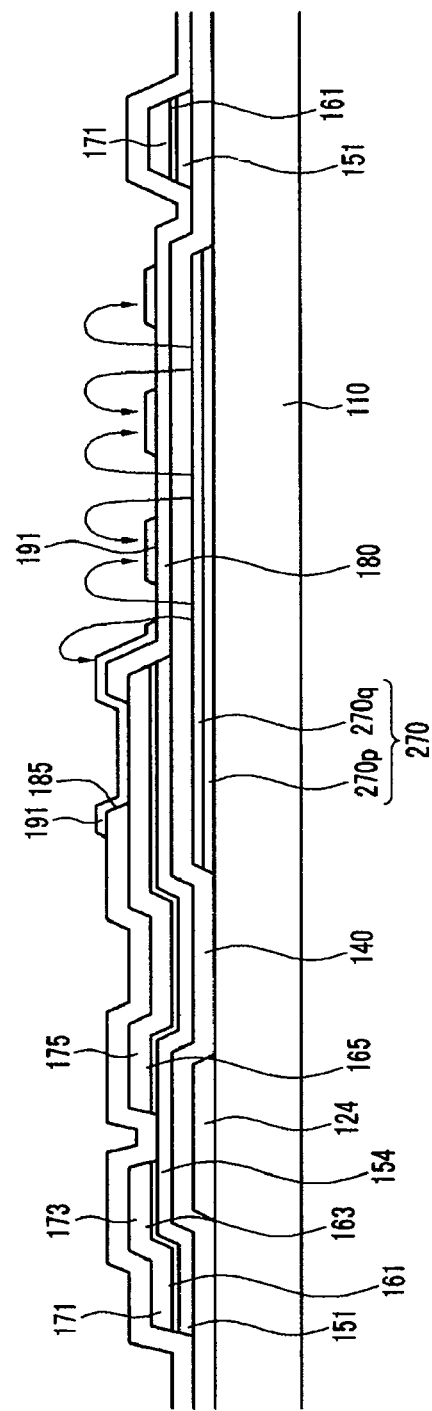
FIGS. 19A and 19B are sectional views of the TFT array panel shown in FIG. 18 taken along the line XIXA-XIXA and XIXB-XIXB, respectively.
Figure 19B:
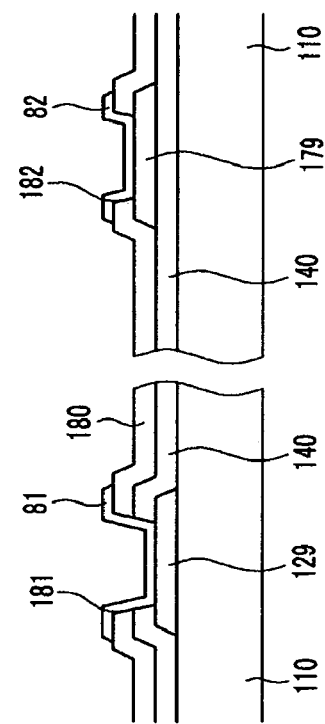
Figure 28:
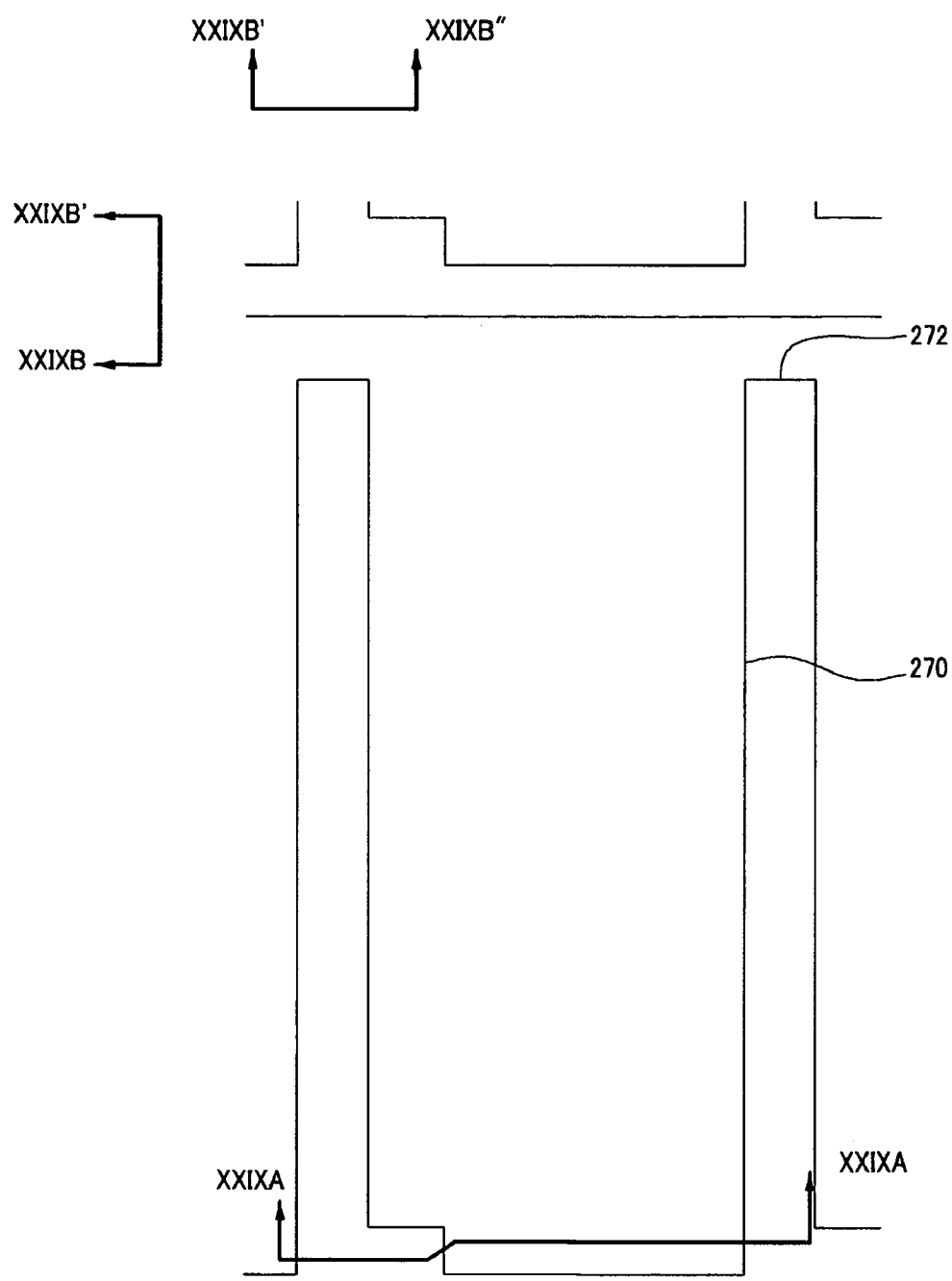
FIG. 28 is a layout view of a TFT array panel shown in FIGS. 18 to 19B in the first step of a manufacturing method thereof according to an embodiment of the present invention.
Figure 29A:
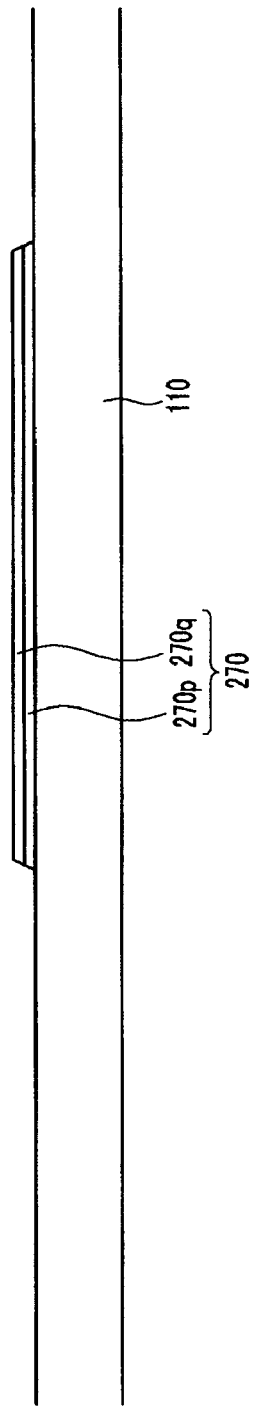
FIGS. 29A and 29B are sectional views of the TFT array panel shown in FIG. 28 taken along the lines XXIXA-XXIXA and XXIXB-XXIXB'-XXIXB", respectively.
Figure 29B:
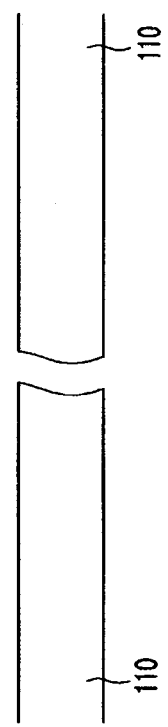
Figure 30:
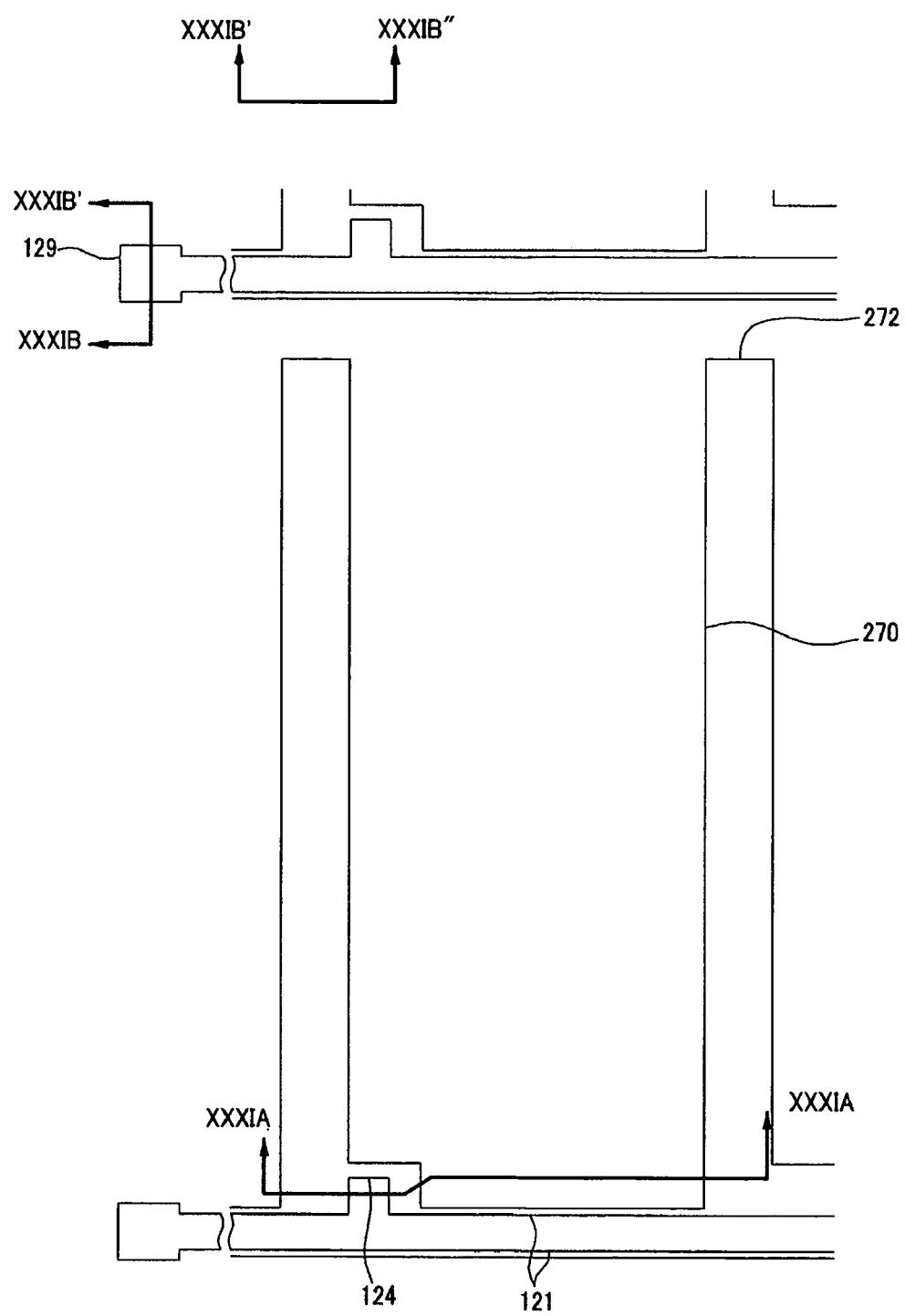
FIG. 30 is a layout view of the TFT array panel in the step following the step shown in FIG. 28.
Figure 31A:
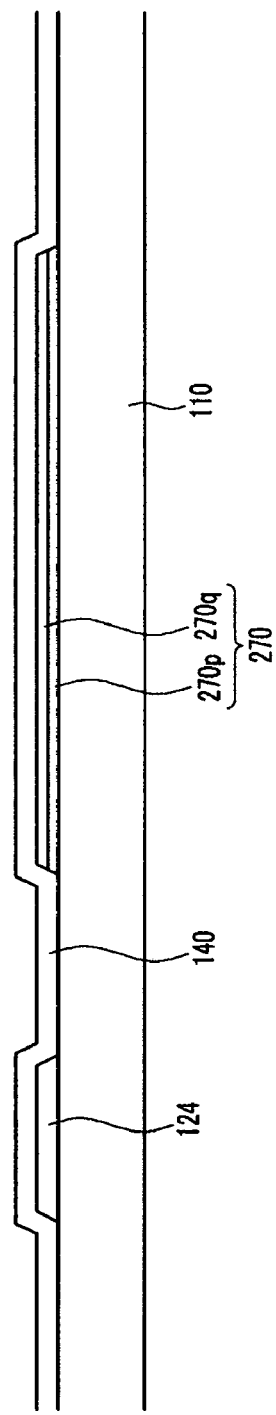
FIGS. 31A and 31B are sectional views of the TFT array panel shown in FIG. 30 taken along the lines XXXIA-XXXIA and XXXIB-XXXIB'-XXXIB", respectively.
Figure 31B:
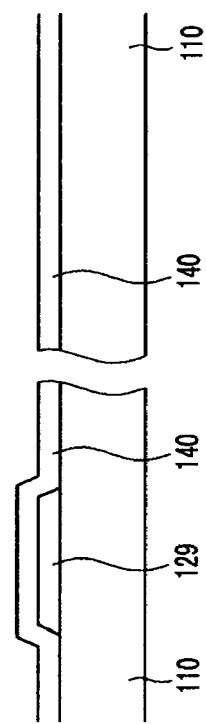
Figure 32:
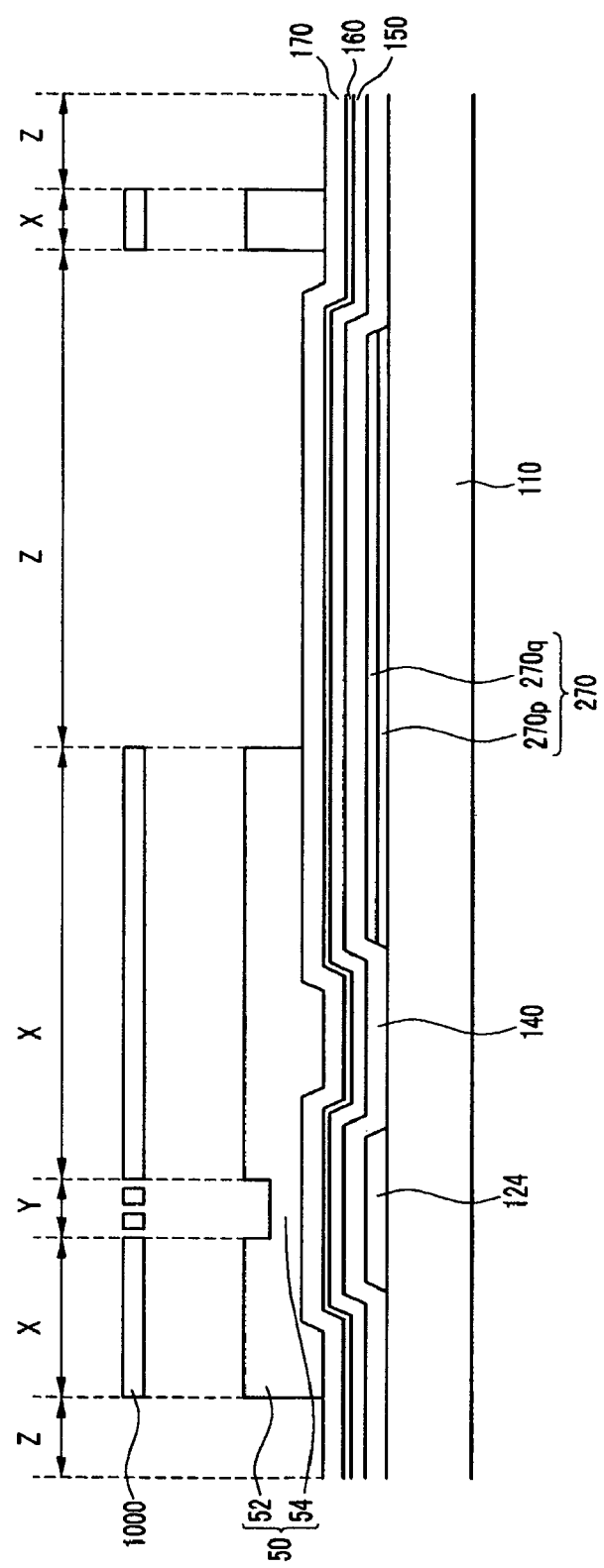
FIGS. 32 and 33 are sectional views of the TFT array panel shown in FIG. 30 taken along the lines XXXIA-XXXIA, respectively, in the step following the step shown in FIG. 31A.
Figure 33:
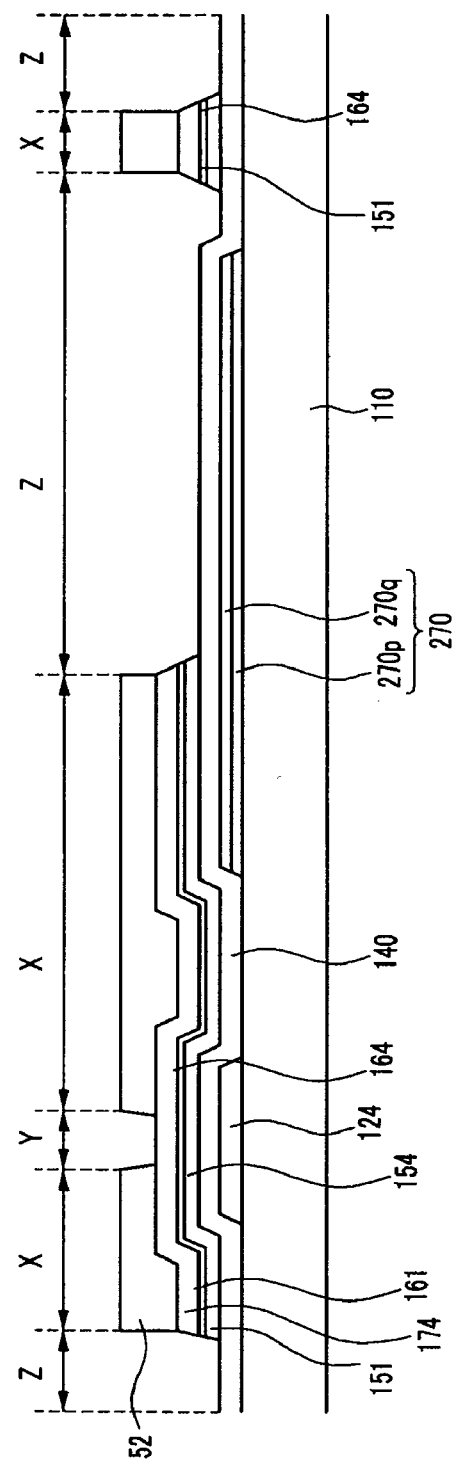
Figure 34:
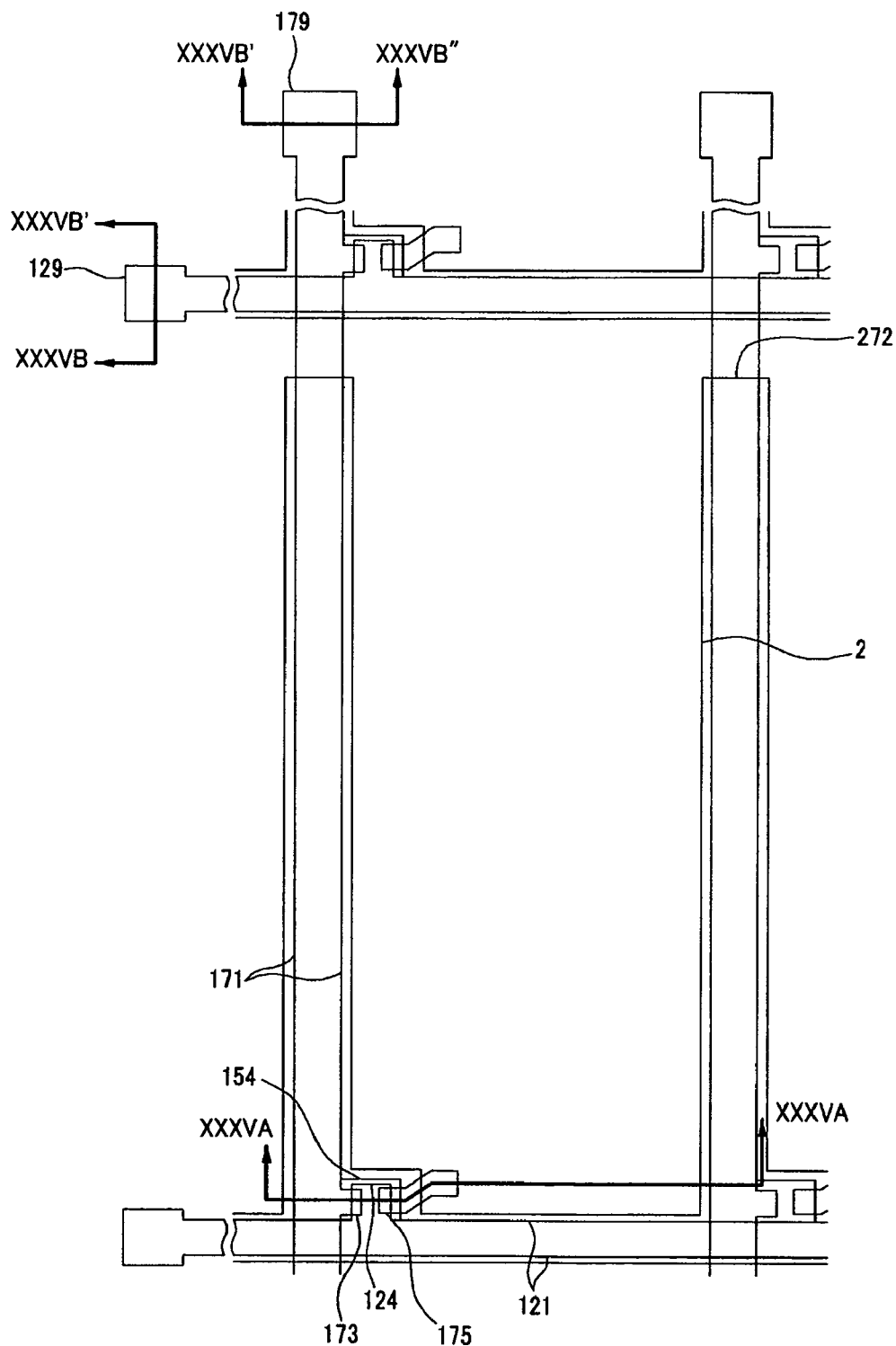
FIG. 34 is a layout view of the TFT array panel in the step following the step shown in FIG. 33.
Figure 35A:
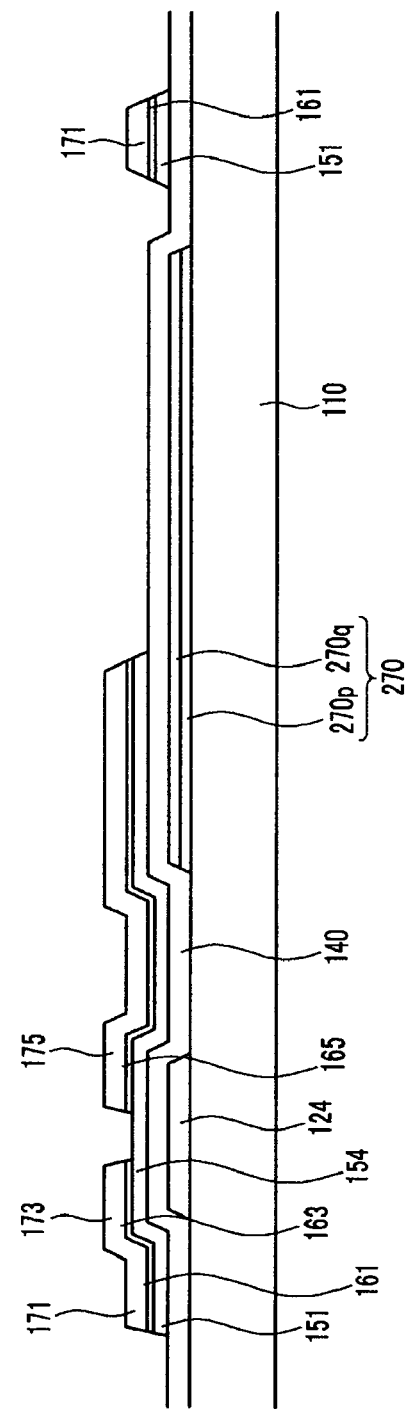
FIGS. 35A and 35B are sectional views of the TFT array panel shown in FIG. 34 taken along the lines XXXVA-XXXVA and XXXVB-XXXVB'-XXXVB", respectively.
Figure 35B:
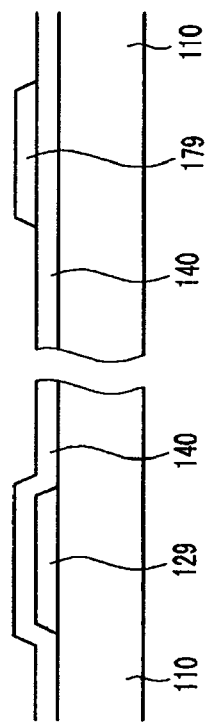
Figure 36:
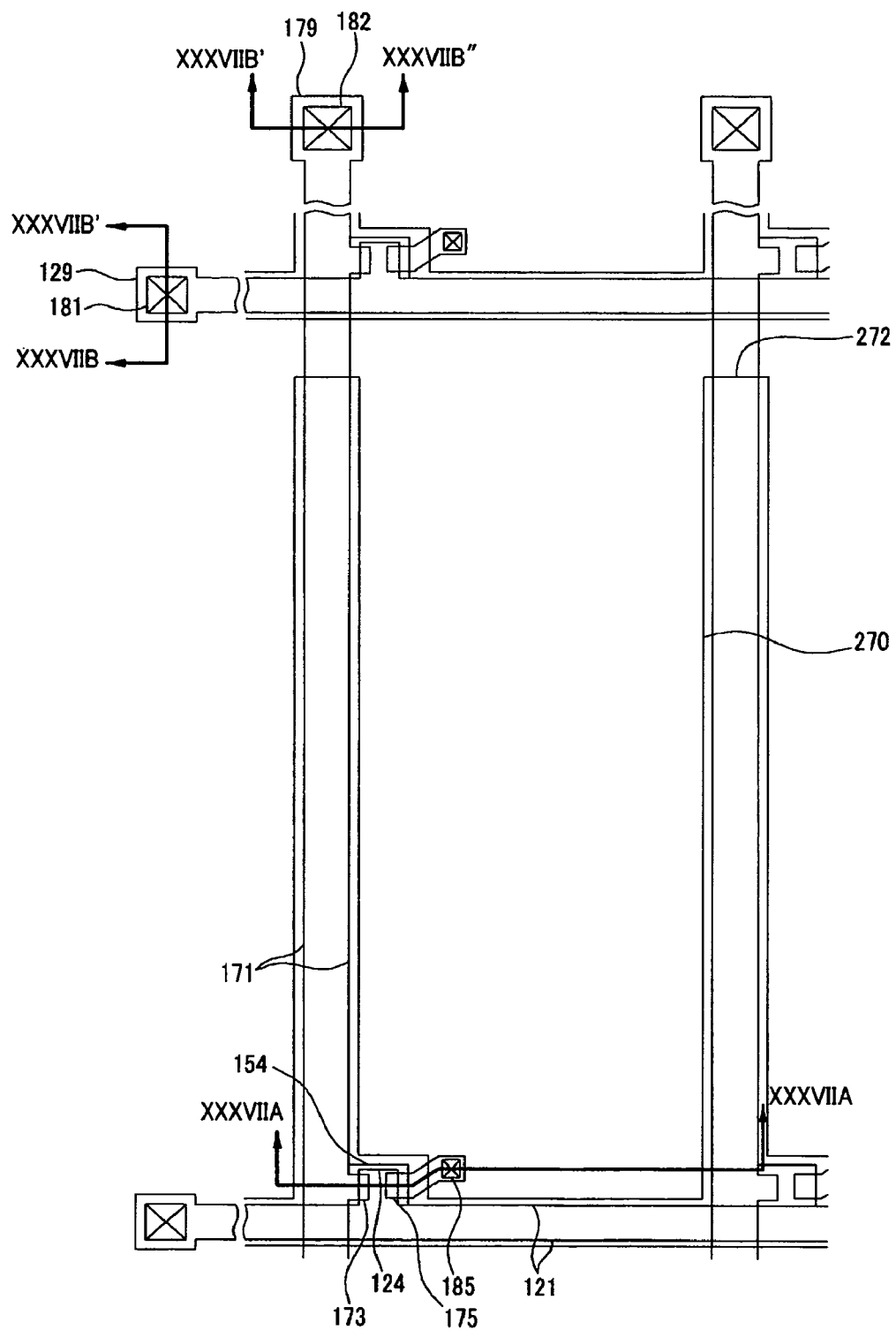
FIG. 36 is a layout view of the TFT array panel in the step following the step shown in FIG. 34.
Figure 37A:
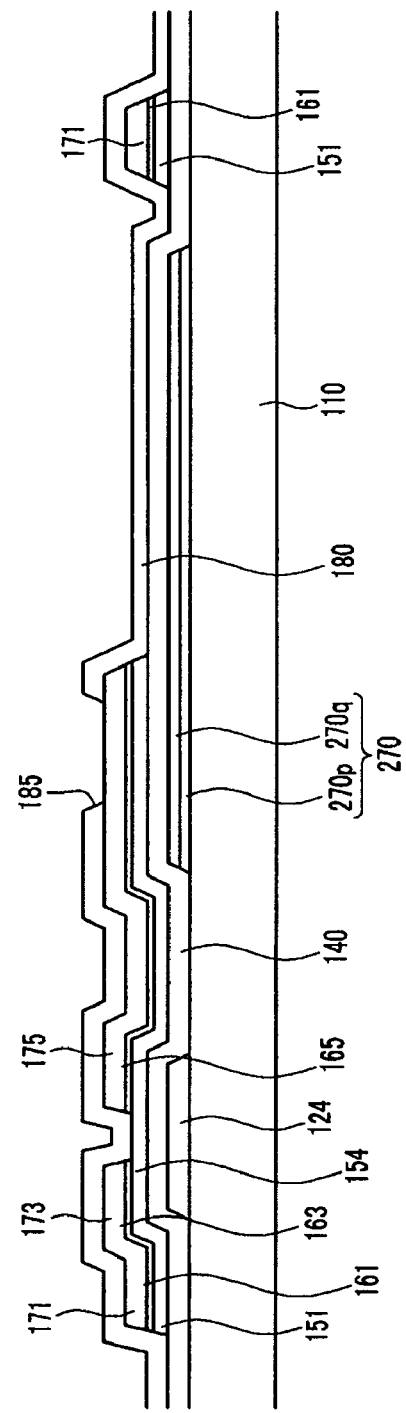
FIGS. 37A and 37B are sectional views of the TFT array panel shown in FIG. 36 taken along the lines XXXVIIA-XXXVIIA and XXXVIIB-XXXVIIB'-XXXVIIB", respectively.
Figure 37B:
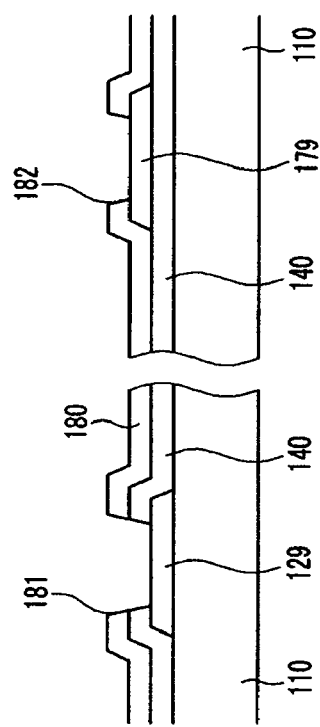

FIG. 28 is a layout view of a TFT array panel shown in FIGS. 18 to 19B in the first step of a manufacturing method thereof according to an embodiment of the present invention, FIGS. 29A and 29B are sectional views of the TFT array panel shown in FIG. 28 taken along the lines XXIXA-XXIXA and XXIXB-XXIXB'-XXIXB", respectively, FIG. 30 is a layout view of the TFT array panel in the step following the step shown in FIG. 28, FIGS. 31A and 31B are sectional views of the TFT array panel shown in FIG. 30 taken along the lines XXXIA-XXXIA and XXXIB-XXXIB'-XXXIB", respectively, FIGS. 32 and 33 are sectional views of the TFT array panel shown in FIG. 30 taken along the lines XXXIA-XXXIA, respectively, in the step following the step shown in FIG. 31A, FIG. 34 is a layout view of the TFT array panel in the step following the step shown in FIG. 33 and FIGS. 35A and 35B are sectional views of the TFT array panel shown in FIG. 34 taken along the lines XXXVA-XXXVA and XXXVB-XXXVB'-XXXVB", respectively, FIG. 36 is a layout view of the TFT array panel in the step following the step shown in FIG. 34, and FIGS. 37A and 37B are sectional views of the TFT array panel shown in FIG. 36 taken along the lines XXXVIIA-XXXVIIA and XXXVIIB-XXXVIIB'-XXXVIIB", respectively.

Referring to FIGS. 28 to 29B, a transparent layer is sputtered on an insulating substrate 110 such as transparent glass and photo-etched to form a plurality of common electrodes 270.

Here, the common electrodes 270 are made of the transparent material including a nitride gradient. Preferably, the common electrodes 270 may be made of a single layer of ITON, IZON, or a-ITON, or a double layer of ITO/ITON, IZO/IZON, or a-a-ITO/a-ITON.

In the former, the ITO, IZO, or a-ITO is supported at $N_2$ atmosphere to form the common electrodes 131. Preferably the thickness of the ITO, IZO, or a-ITO layer is in the range of 10-3,000 angstroms, and that the layer of ITON, IZON, or a-ITON includes the nitrogen content of 0.001-90 atomic percent.

In the latter, the ITO, IZO, or a-ITO is deposited to form the lower layer 270p of the common electrodes 270, and the nitrification process of injecting nitrogen gas is secondly executed to form the upper layer 270q of ITON, IZON, or a-ITON. Alternatively, the ITO, IZO, or a-ITO is deposited to form the lower layer 270p of the common electrodes 270, then $NH_3$ plasma treatment is performed to form the upper layer 270q of ITON, IZON, or a-ITON before forming a nitride layer as a gate insulating layer 140.

The thickness of the upper layer 270 may be in the range of 10-1,000 angstroms, and the layer of ITON, IZON, or a-ITON preferably includes a nitrogen content of 0.001-90 atomic percent.

As above-described, because the common electrodes 270 are made of a single layer of ITON, IZON, or a-ITON, or a double layer of ITO/ITON, IZO/IZON, or a-ITO/a-ITON, when $H_2$ or $SiH_4$ are injected to form a silicon nitride ($SiN_g$) layer on the common electrodes 270, the opaque metal Sn or Zn in which the metal component reduced in the IZO, ITO, or a-ITO is not produced on the surfaces of the common electrodes 131.

Referring to FIGS. 30 to 31B, a plurality of gate lines 121 including a plurality of gate electrodes 124 are formed on the insulating substrate 110, and a gate insulating layer 140 covering the gate lines 121 and the common electrodes 270 is deposited by CVD. The gate insulating layer 140 may be made of silicon nitride or silicon oxide.

Referring to FIG. 32, an intrinsic a-Si layer 150 and an extrinsic a-Si layer 160 are sequentially deposited by CVD on the gate insulating layer 140. A conductive layer 170 is deposited by sputtering, and a photoresist 50 is coated on the conductive layer 170. The photoresist is exposed to light through exposure through a slit mask 1000 and developed to form a graduated photoresist film 50.

The developed photoresist film 50 has a position-dependent thickness. The photoresist shown in FIG. 32 includes a plurality of first to third portions with decreasing thickness. The first portions located on wire areas X and the second portions located on channel areas Y are indicated by reference numerals 52 and 54, respectively, and no reference numeral is assigned to the third portions located on remaining areas Z since they have substantially zero thickness such that they expose underlying portions of the conductive layer 170. The thickness ratio of the second portions 54 to the first portions 52 is adjusted depending upon the process conditions in the subsequent process steps. It is preferable that the thickness of the second portions 54 is equal to or less than half of the thickness of the first portions 52.

The position-dependent thickness of the photoresist is obtained by several techniques, for example by providing a mask having a slit pattern or a lattice pattern, or a thin film(s) with intermediate transmittance or intermediate thickness, corresponding to the second portion 54 of the photoresist. When using a slit pattern, it is preferable that the width of the slits or the distance between the slits is smaller than the resolution of a light exposer used for the photolithography. Another example is to use a reflowable photoresist. In detail, once a photoresist pattern made of a reflowable material is formed by using a normal exposure mask with only transparent areas and opaque areas, it is subject to a reflow process to flow onto areas without the photoresist, thereby forming thin portions.

For descriptive purpose, portions of the conductive layer 170, the extrinsic a-Si layer 160, and the intrinsic a-Si layer 150 on the wire areas X are called first portions, portions of the conductive layer 170, the extrinsic a-Si layer 160, and the intrinsic a-Si layer 150 on the channel areas Y are called second portions, and portions of the conductive layer 170, the extrinsic a-Si layer 160, and the intrinsic a-Si layer 150 on the remaining areas Z are called third portions.

Referring to FIG. 33, the exposed third portions of the conductive layer 170 on the remaining areas Z are removed by wet etching or dry etching to expose the underlying third portions of the extrinsic a-Si layer 160.

Reference numeral 174 indicates conductors of the conductive layer 170 including the data lines 171 and the drain electrodes 175 connected to each other.

Next, the third portions of the extrinsic a-Si layer 160 and the intrinsic a-Si layer 150 on the areas Z are removed, preferably by dry etching, and the second portions 54 of the photoresist 50 are removed to expose the second portions of the conductors 174.

The removal of the second portions 54 of the photoresist 50 are performed either simultaneously with, or independent from, the removal of the third portions of the extrinsic a-Si layer 160 and of the intrinsic a-Si layer 150. Residue of the second portions 54 of the photoresist 50 remaining on the areas Y is removed by ashing.

The semiconductor stripes 151 are completed in this step, and reference numeral 164 indicates portions of the extrinsic a-Si layer 160 including the ohmic contact stripes and islands 161 and 165 connected to each other, which are called "extrinsic semiconductor stripes."

Referring to FIGS. 34 to 35B, the second portions of the conductors 174 and the extrinsic a-Si stripes 164 on the areas Y, as well as the first portion 52 of the photoresist, are removed.

Top portions of the projections 154 of the intrinsic semiconductor stripes 151 on the areas Y may be removed to cause a thickness reduction, and the first portions 52 of the photoresist 50 are etched to a predetermined thickness.

In this way, each conductor 174 is divided into a data line 171 and a plurality of drain electrodes 175 to be completed, and each extrinsic semiconductor stripe 164 is divided into an ohmic contact stripe 161 and a plurality of ohmic contact islands 165 to be completed.

Referring to FIGS. 36 to 37B, a passivation layer 180 is formed by CVD of silicon nitride, or by PECVD of a low dielectric insulating material such as a-Si:C:O and a-Si:O:F having a low dielectric constant. Thereafter, the passivation layer 180 and the gate insulating layer 140 are photo-etched to form-a plurality of contact holes 181, 182, and 185.

Finally, as shown in FIGS. 18 to 19B, a plurality of pixel electrodes 191 and a plurality of contact assistants 81 and 82 are formed on the passivation layer 180 by sputtering and photo-etching an ITO or IZO layer.

Figure 38:
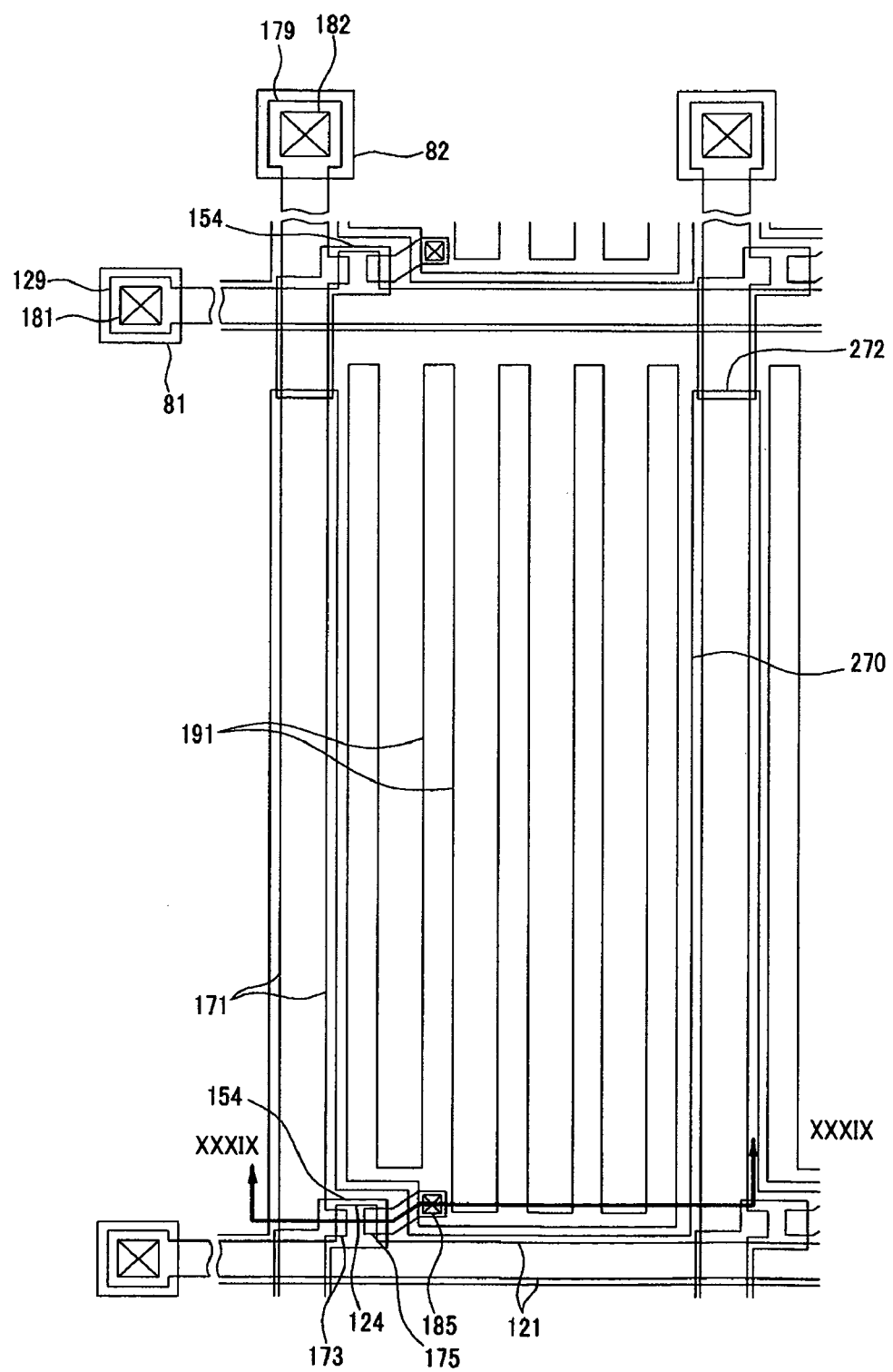
FIG. 38 is a layout view of a TFT array panel for an LCD according to another embodiment of the present invention.
Figure 39:
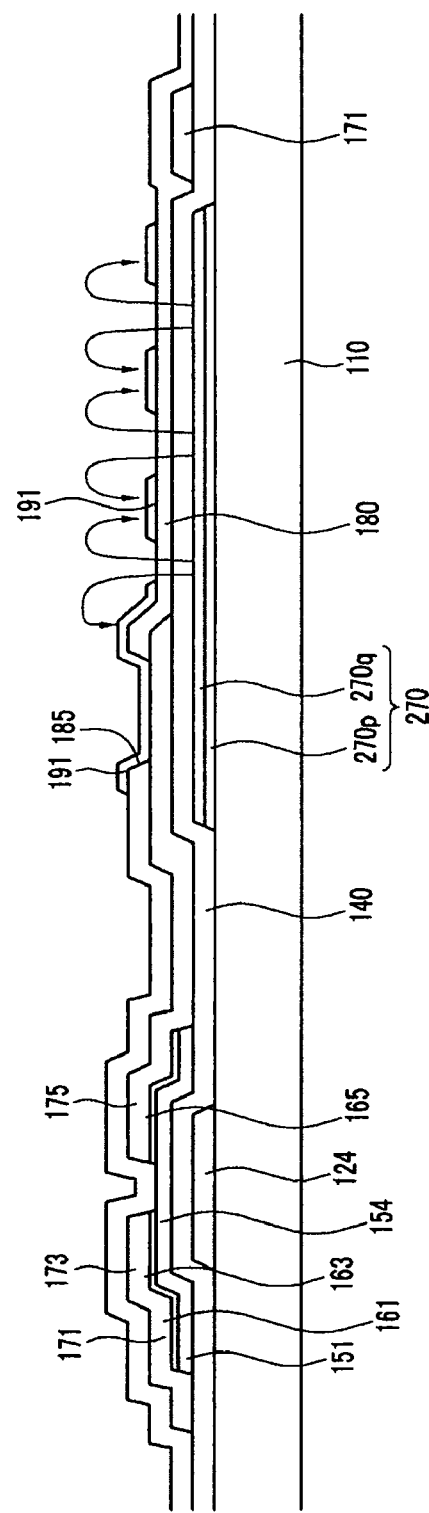
FIG. 39 is sectional view of the TFT array panel shown in FIG. 18 taken along the line XXXIX-XXXIX.

FIG. 38 is a layout view of a TFT array panel for an LCD according to another embodiment of the present invention, and FIG. 39 is a sectional view of the TFT array panel shown in FIG. 18 taken along the line XXXIX-XXXIX.

Referring to FIGS. 38 and 39, layered structures of the TFT panels according to this embodiment are almost the same as those shown in FIGS. 18 to 19B.

A plurality of gate lines 121 including gate electrodes 124 and end portions 129 and a plurality of common electrodes 270 are formed on a substrate 110, and a gate insulating layer 140, a plurality of semiconductor projections 154, and a plurality of ohmic contact projections 163 and 165 are sequentially formed thereon. A plurality of data lines 171 including source electrodes 173 and end portions 179, and a plurality of drain electrodes 175, are formed on the ohmic contacts 163 and 165 and the gate insulating layer 140, and a lower passivation layer 180a is formed thereon. A passivation layer 180 is formed thereon, and a plurality of contact holes 181,182, and 185 are provided at the passivation layer 180, and/or the gate insulating layer 140. A plurality of pixel electrodes 191 and a plurality of contact assistants 81 and 82 are also formed on the passivation layer 180.

In contrast to the thin film transistor panel shown in FIGS. 18 to 19B, the semiconductor projections 154 are island shaped, and have the portions located between the source electrodes 173 and the drain electrodes 175 and form the channel of the TFT. Although the width of the semiconductor projections 154 becomes large near the gate lines 121 and the common electrodes 270 as described above, the profile of the surface is smoothed, thereby preventing disconnection of the data-lines 171.

Many of the above-described features of the TFT panel may be appropriate to the TFT array panel shown in FIGS. 18 to 19B.

As above-described, because the pixel electrode includes ITON or IZON, the opaque metal is not produced on the surfaces of the pixel electrode when executing $H_2$ cleaning. Accordingly, a thin film transistor panel having high quality may be provided.

Furthermore, because the common electrodes are made of ITON, IZON, or a-ITON, or a double layer of ITO/ITON, IZO/IZON, or a-ITO/a-ITON, when $H_2$ or $SiH_4$ are injected to form a silicon nitride ($SiN_x$) layer on the common electrodes, the opaque metal Sn or Zn in which a metal component is reduced in the IZO, ITO, or a-ITO is not produced on the surfaces of the common electrode.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of manufacturing a thin film transistor array panel, comprising:

forming a gate line on a substrate;

forming a common electrode having a transparent conductive layer on the substrate;

depositing a gate insulating layer covering the gate line and the common electrode;

forming a semiconductor layer on the gate insulating layer;

forming a data line and a drain electrode on the gate insulating layer and the semiconductor layer; and forming a pixel electrode connected to the drain electrode, wherein the pixel electrode and the common electrode at least partially overlap each other; and wherein the transparent conductive layer is comprised of indium tin oxide nitride (ITON), indium zinc oxide nitride (IZON), or amorphous indium tin oxide nitride (a-ITON).

2. The method of claim 1, wherein the ITON, IZON, or a-ITON are formed by sputtering ITO, IZO, or a-ITO under a nitrogen atmosphere.

3. The method of claim 1, wherein a thickness of the ITON, IZON, or a-ITON is in the range of 10-3,000 angstroms.

4. The method of claim 1, wherein the transparent conductive layer is comprised of double layer structure of indium tin oxide/indium tin oxide nitride (ITO/ITON), indium zinc oxide/indium zinc oxide/indium zinc oxide nitride (IZO/IZON), or amorphous indium tin oxide/amorphous indium tin oxide nitride (a-ITO/a-ITON).

5. The method of claim 4, wherein the formation of the double layer structure of ITO/ITON, IZO/IZON, or a-ITO/a-ITON comprises:

forming a first conductive layer of ITO, IZO, or a-ITO; and forming a second layer of ITON, IZON, or a-ITON using reaction sputtering while injecting nitrogen gas.

6. The method of claim 4, wherein the formation of the double layer structure of ITO/ITON, IZO/IZON, or a-ITO/a-ITON comprises:

forming a first conductive layer of ITO, IZO, or a-ITO; and forming a second layer of ITON, IZON, or a-ITON using $NH_3$ plasma.

7. The method of claim 6, wherein a thickness of the ITON, IZON, and a-ITON is in the range of 50-1,000 angstroms.

* * * * *